US006858943B1

(12) United States Patent
Peterson et al.

(10) Patent No.: US 6,858,943 B1
(45) Date of Patent: Feb. 22, 2005

(54) RELEASE RESISTANT ELECTRICAL INTERCONNECTIONS FOR MEMS DEVICES

(75) Inventors: Kenneth A. Peterson, Albuquerque, NM (US); Stephen E. Garrett, Albuquerque, NM (US); Cathleen A. Reber, Corrales, NM (US)

(73) Assignee: Sandia Corporation, Albuquerque, NM (US)

(*) Notice: Subject to any disclaimer, the term of this patent is extended or adjusted under 35 U.S.C. 154(b) by 0 days.

(21) Appl. No.: 10/396,879

(22) Filed: Mar. 25, 2003

(51) Int. Cl.[7] .......................... H01L 23/48; H01L 23/52; H01L 29/40
(52) U.S. Cl. ........................................ 257/784; 257/786
(58) Field of Search ................................ 257/784, 758, 257/785, 786, 737, 738; 438/612

(56) References Cited

U.S. PATENT DOCUMENTS

| | | | |
|---|---|---|---|
| 5,023,697 A | | 6/1991 | Tsumura ........................ 357/65 |
| 5,298,715 A | | 3/1994 | Chalco et al. ......... 219/121.64 |
| 5,302,550 A | | 4/1994 | Hirota et al. ................ 437/194 |
| 5,665,649 A | * | 9/1997 | Harris et al. ................. 156/256 |
| 5,804,084 A | | 9/1998 | Nasby et al. .................... 216/2 |
| 5,821,627 A | * | 10/1998 | Mori et al. .................... 257/737 |
| 5,928,458 A | * | 7/1999 | Aschenbrenner et al. ... 156/292 |
| 5,945,065 A | | 8/1999 | Kikuchi et al. ............. 420/507 |
| 5,948,286 A | | 9/1999 | Chalco et al. ......... 219/121.63 |
| 5,984,162 A | * | 11/1999 | Hortaleza et al. ............ 228/1.1 |
| 5,989,364 A | | 11/1999 | Kitamura ..................... 148/430 |
| 6,060,968 A | * | 5/2000 | Baltus et al. ................ 333/247 |
| 6,082,208 A | | 7/2000 | Rodgers et al. ................ 74/406 |
| 6,103,025 A | | 8/2000 | Herklotz et al. ............. 148/430 |
| 6,204,455 B1 | * | 3/2001 | Gilleo et al. ................. 174/261 |
| 6,213,382 B1 | | 4/2001 | Akimoto ...................... 228/164 |
| 6,252,301 B1 | * | 6/2001 | Gilleo et al. ................. 257/690 |
| 6,286,205 B1 | * | 9/2001 | Faraci et al. ........... 228/180.22 |
| 6,376,375 B1 | * | 4/2002 | Hewitt-Bell et al. ........ 438/687 |
| 6,383,401 B1 | * | 5/2002 | Labzentis et al. ............. 216/13 |
| 6,500,760 B1 | * | 12/2002 | Peterson et al. ............. 438/684 |
| 2002/0056925 A1 | * | 5/2002 | Kang et al. .................. 257/784 |
| 2002/0185733 A1 | * | 12/2002 | Chow et al. ................. 257/737 |
| 2004/0004292 A1 | * | 1/2004 | Hsieh et al. ................. 257/778 |

OTHER PUBLICATIONS

Wire Bonding Module; http://www.eccb.org/pbps/tg/wirebound.htm.
Room Temperature Bonding Using Higher Frequencies by ESEC ASIA Pacific Pte Ltd Wirebound Process Research and Development; http://www.aprova.com/room_temp_bound_1.htm.
Sandia National Laboratories, Intelligent Micromachine Initiative, SUMMIT Technology; http://www.mdl.sandia.gov/micromachine/trilevel.html.
Sandia National Laboratories, Intelligent Micromachine Initiative, Integrated MicroElectroMechanical Systems; http://www.mdl.sandia.gov/micromachine/integrated.html.

* cited by examiner

Primary Examiner—Phat X. Cao
(74) Attorney, Agent, or Firm—Robert D. Watson

(57) ABSTRACT

A release resistant electrical interconnection comprising a gold-based electrical conductor compression bonded directly to a highly-doped polysilicon bonding pad in a MEMS, IMEMS, or MOEMS device, without using any intermediate layers of aluminum, titanium, solder, or conductive adhesive disposed in-between the conductor and polysilicon pad. After the initial compression bond has been formed, subsequent heat treatment of the joint above 363 C creates a liquid eutectic phase at the bondline comprising gold plus approximately 3 wt % silicon, which, upon re-solidification, significantly improves the bond strength by reforming and enhancing the initial bond. This type of electrical interconnection is resistant to chemical attack from acids used for releasing MEMS elements (HF, HCL), thereby enabling the use of a "package-first, release-second" sequence for fabricating MEMS devices. Likewise, the bond strength of an Au—Ge compression bond may be increased by forming a transient liquid eutectic phase comprising Au-12 wt % Ge.

15 Claims, 28 Drawing Sheets

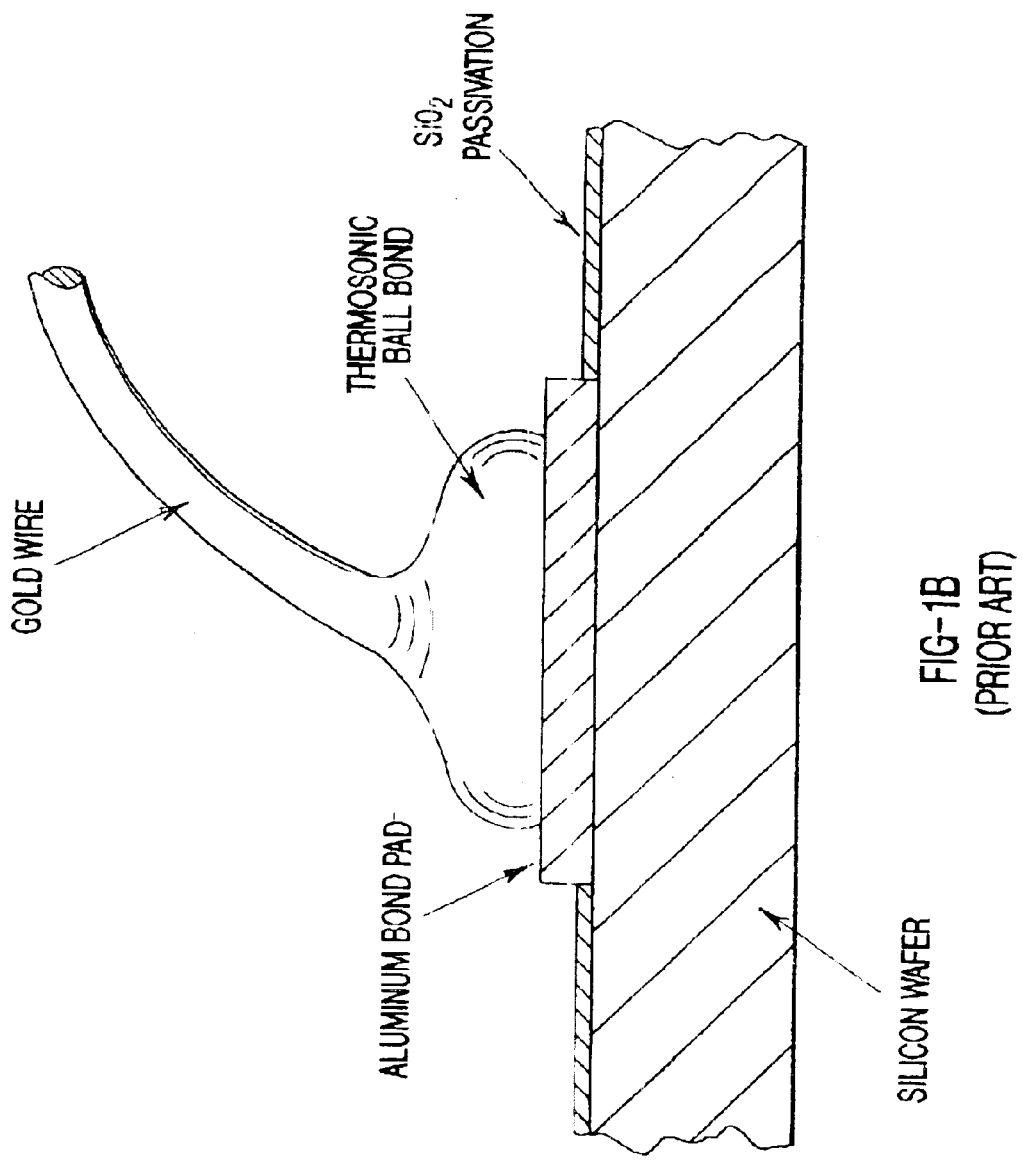

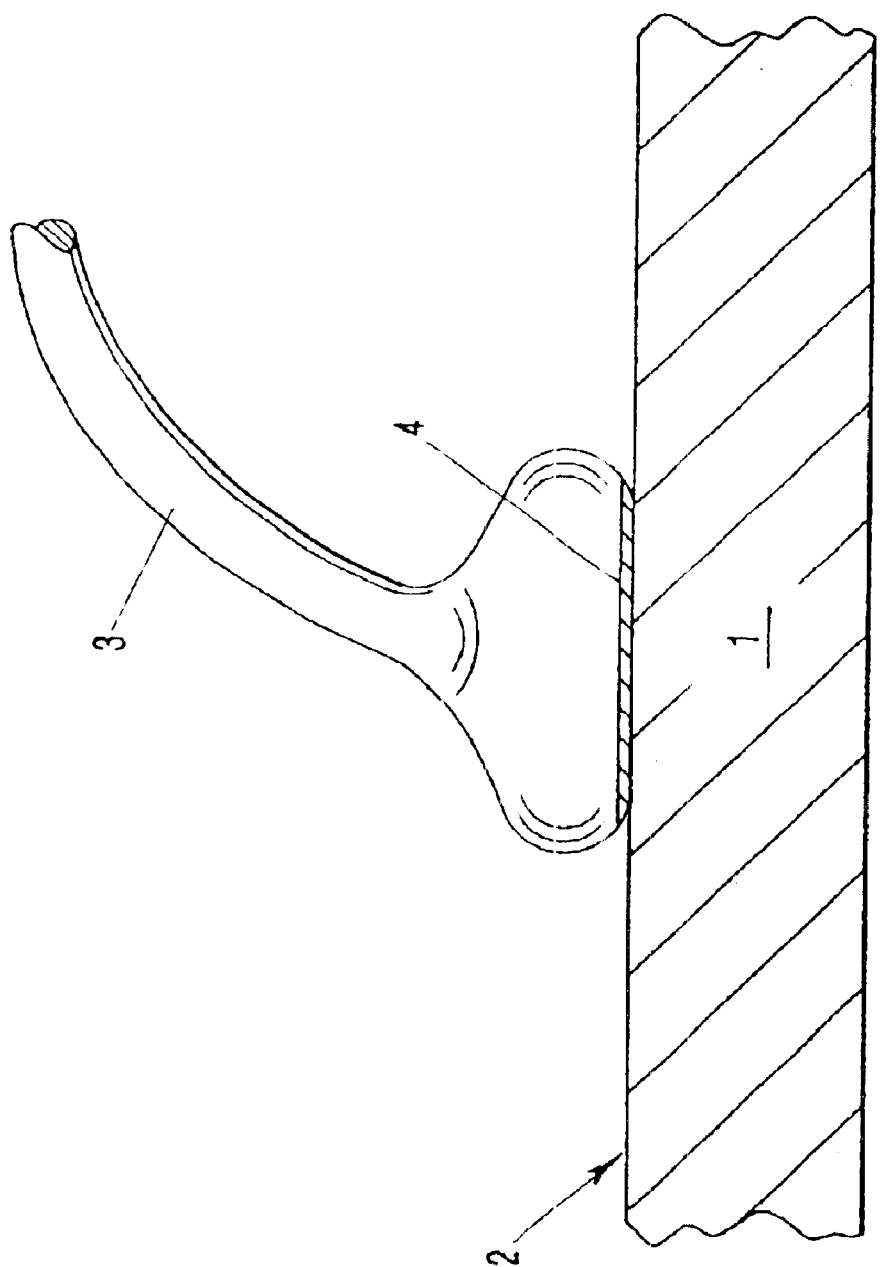

Gold-silicon phase diagram

RELEASE RESISTANT ELECTRICAL INTERCONNECTIONS FOR MEMS DEVICES

FEDERALLY SPONSORED RESEARCH

The United States Government has rights in this invention pursuant to Department of Energy Contract No. DE-AC04-94AL85000 with Sandia Corporation.

BACKGROUND OF THE INVENTION

The present invention relates generally to the process of making gold-based electrical interconnections for microelectronic devices, including MEMS (Micro-Electro-Mechanical-Systems) devices and IMEMS (Integrated MEMS) devices. Examples of MEMS devices include micro-accelerometers for airbag sensors, micro-mirror arrays for digital light projectors, optical switches for fiber optic systems, and micro-pressure sensors.

Conventional methods for electrically interconnecting a MEMS or IMEMS device to a leadframe, electrode, or other electrical conductor on a package typically use ultrasonically wedge-bonding of an aluminum wire to an aluminized polysilicon bonding pad located on a pre-released MEMS device (see FIG. 1A). For other types of microelectronic devices, including conventional semiconductor IC's, electrical interconnections are made by thermosonically ball-bonding a gold wire to an aluminum bonding pad (see FIG. 1B). IMEMS (Integrated Micro-Electro-Mechanical-Systems) devices combine side-by-side integrated circuits (e.g. CMOS IC's) with MEMS structures on the same substrate (e.g. silicon wafer), also use aluminum wires and aluminum bond pads for electrical interconnections. MOEMS (Micro Optical Electro Mechanical Systems) are MEMS devices that incorporate micro-optical elements, such as micro-mirrors, micro-lenses, and micro fiber optic switches, for example.

Surface micromachined MEMS devices need to be released in order to make them functional (bulk MEMS are already free). The release step generally involves exposing the alternating layers (i.e., levels) of structural polysilicon and sacrificial glass (silicon dioxide) in a multi-level MEMS device to an etchant that includes hydrofluoric acid (HF) or hydrochloric acid (HCl), or a mixture thereof (e.g., a 50/50 mixture). The acid etches away the sacrificial glass layer(s) and releases the delicate polysilicon MEMS structures (e.g., micromachined gears, mirrors, cantilever beams, sliders, pivots, ratchets, etc.). Typically, this release step is performed before the electrical interconnections have been made because the acid etchant will attack and damage the aluminum wires and/or aluminum bonding pads (especially by HCl acid). The acid etchant will also attack any titanium adhesion layer(s), especially by HF acid.

Once the delicate MEMS structures are released and are free to move, they are also unprotected and may be damaged during subsequent packaging steps. These packaging steps can include: sawing, cutting, or scribing the large diameter wafer into individual chips or device dies (singulation or dicing); attaching the device to the package (die attach); wirebonding; flip-chip solder bumping; thin or thick-film metallization; plating; pre-seal inspection; sealing of hermetic or dust protection cover lids; windowing; package sealing; trim; marking; final test; shipping; storage; and installation (e.g., soldering or plugging into another assembly or board). Potential risks to the delicate released MEMS structures include: electrostatic effects, dust, moisture, contamination, handling stresses, shock, and thermal effects. The term "die singulation" includes laser cutting, sawing, scribing, precision breaking, and water jet cutting.

After the MEMS structures have been released, a thin layer(s) of anti-stiction coating or lubricant, e.g., self-assembling monolayers (SAM coating), may be applied to reduce friction and enhance performance. However, presence of these coatings on the surface of the polysilicon bonding pad can act as an organic contaminant and interfere with making a good electrical interconnection.

The reliability and yield of packaged MEMS or IMEMS devices could be significantly improved if the acid etch release step could be performed after as many of the potentially harmful packaging steps had been completed as possible. In particular, the acid etch release step could be performed after the electrical interconnections have been made. This would be possible if the electrical interconnections were either: (1) isolated from the acid etchant, and/or (2) made from materials (such as gold) that are naturally resistant or impervious to attack by HCl or HF acid. Therefore, a release resistant electrical interconnection for MEMS or IMEMS devices preferably would not use aluminum wires, aluminum or aluminized bond pads, or titanium adhesion layers. Here, we define "aluminum bond pads" as including (1) a bond pad made of aluminum (or Al-alloy) bonded to a silicon substrate, or (2) an aluminized coating (metallized aluminum) on top of a polysilicon bonding pad. We also define MEMS devices to generically include IMEMS (Integrated MEMS) and MOEMS (Micro Optical Electrical Mechanical Systems) devices.

U.S. Pat. No. 6,500,760 "Gold-Based Electrical Interconnections for Microelectronic Devices", which is incorporated by reference, describes methods of fabricating release-resistant electrical interconnections for microelectronic devices, including MEMS and IMEMS devices.

Against this background, the present invention was developed.

BRIEF DESCRIPTION OF THE DRAWINGS

The accompanying drawings, which are incorporated in and form part of the specification, illustrate various examples of the present invention and, together with the detailed description, serve to explain the principles of the invention.

FIG. 1B shows a schematic cross-section side view of a conventional thermosonically ball-bonded gold wire bonded to an aluminum bonding pad located on a conventional semiconductor IC.

FIG. 1C shows an isometric view of a schematic electrical interconnection between a microelectronic device and a gold-based conductor, according to a first embodiment of the present invention.

BRIEF SUMMARY OF THE INVENTION

Figure 1A:
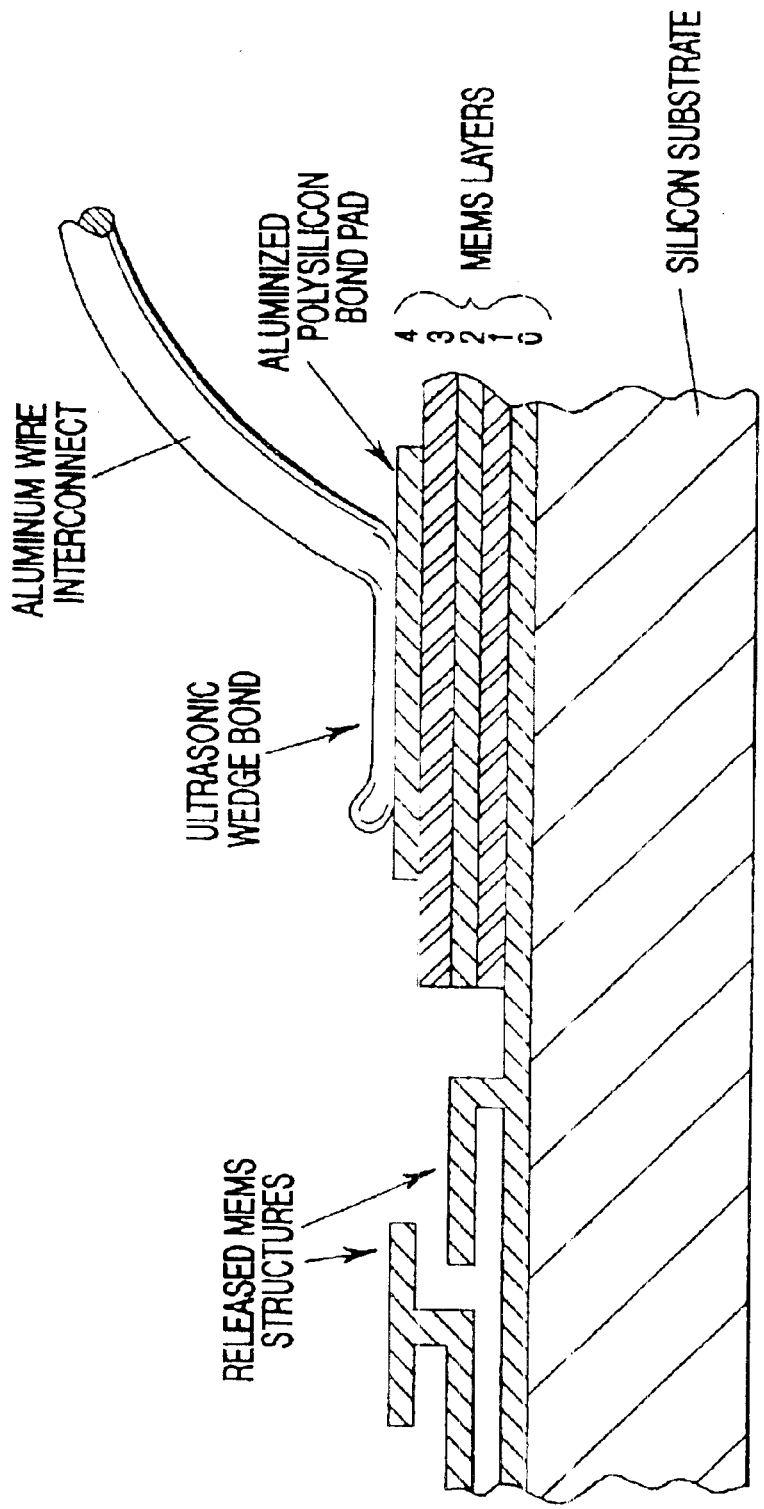
FIG. 1A shows a schematic cross-section side view of a conventional ultrasonically wedge-bonded aluminum wire bonded to an aluminized polysilicon bonding pad on a MEMS device.

The present invention relates to a release-resistant electrical interconnection comprising a gold-based electrical conductor compression bonded directly to a highly-doped polysilicon bonding pad in a MEMS, IMEMS, or MOEMS device, without using any intermediate layers of aluminum, titanium, solder, or conductive adhesive disposed in-between the conductor and polysilicon pad. After the initial compression bond has been formed, subsequent heat treatment of the joint above 363 C creates a liquid eutectic phase at the bondline comprising gold plus approximately 3 wt % silicon, which, upon re-solidification, significantly improves the bond strength by reforming and enhancing the initial bond. This type of electrical interconnection is resistant to chemical attack from acids used for releasing MEMS elements (HF, HCL), thereby enabling the use of a "package-first, release-second" sequence for fabricating MEMS devices. Likewise, the bond strength of an Au—Ge compression bond may be increased by forming a transient liquid eutectic phase comprising Au-12 wt % Ge.

DETAILED DESCRIPTION OF THE INVENTION

The present invention relates generally to the process of making electrical interconnections to microelectronic devices, including IC's, MEMS, IMEMS, and MOEMS devices. The process, however, has wider applicability, namely, for bonding a gold-based wire or other electrical conductor made substantially of gold (or coated with gold) to a silicon (or germanium) substrate using compression bonding to selectively "activate" the mating surfaces.

The word "silicon" as it relates to a "silicon substrate", "silicon die", "silicon wafer", and "polysilicon bonding pad" is broadly defined to include: (1) single-crystal silicon (as in a large-diameter silicon wafer), (2) polycrystalline silicon (as in thin polysilicon layers used for MEMS structures and for gates on microelectronic devices), (3) silicon on bulk micromachined MEMS devices, (4) doped silicon (n-type, p-type, phosphorus-doped, boron-doped, lightly-doped, heavily-doped, etc.), where doping is used to increase electrical conductivity, and affect other properties, and (5) any coating of silicon on any substrate (e.g., a plastic substrate). The word "polysilicon" or "poly" generally refers to one or more thin (e.g., 0.3–3.0 microns) layers or levels of vapor-deposited or thermally-deposited polycrystalline silicon (e.g., deposited by CVD, PEVCD, PACVD, PVD, TEOS) that are used in fabricating multi-level planar surface micromachined MEMS structures.

The phrase "compression bonding" is defined to include thermocompression bonding, ultrasonic bonding, and thermosonic bonding. All three of these processes apply a compressive force between the gold-based conductor and the silicon (or germanium) substrate to create intimate physical contact. In thermocompression bonding, the compressive force is relatively high, and one (or both) of the parts are pre-heated to relatively high temperatures (typically more than 300 C) prior to bonding. In ultrasonic bonding, ultrasonic vibration is applied during compression, although the compressive force is relatively low, and the process is performed at about room temperature. Thermosonic bonding is a process that combines ultrasonic vibration with the simultaneous application of high compressive stress and plastic deformation at elevated temperatures to create a metallurgical bond between the two mating surfaces. Ultrasonic vibration can generate internal heat by friction heating of the sliding/rubbing surfaces.

Plastic deformation during compression bonding of the ball or wedge bond (due to the action of the compressive force), creates a high compressive stress, which produces intimate surface contact between the bonding surfaces, and an increase in the contact area, with some degree of break-up and disruption of surface oxides or contaminants. The strength and quality of the bonds may be improved by adding ultrasonic vibration to mechanically scrub the mating surfaces, further disrupting surface oxides and removing contaminants. Ultrasonic vibration can also generate internal heat by friction heating of the sliding/rubbing surfaces. The strength and quality of the bonds may be also be improved by making the bond at elevated temperature, which increases solid-state diffusion processes, and softens materials to permit greater plastic flow and to create enhanced intimate physical contact.

Thermocompression and thermosonic bonding generally makes a ball-bond for the first bond, and then a wedge bond for the second bond. In ultrasonic bonding, both bonds are generally wedge bonds, where the second bond lies on the centerline of the first bond. In ball bonding, a ball (with or without an attached wire) is plastically deformed into a squashed pumpkin-like shape. In wedge bonding a wire with a circular or cross-section (or a ribbon with a rectangular cross-section) is plastically deformed and flattened into a wedge-like shape.

The phrase "compression bonding" is also defined to include lasersonic or laser-thermosonic bonding, where the elevated temperatures are created by directing a laser beam on the bond and/or surrounding area to heat and locally generate a temperature rise. The lasersonic technique is described in more detail in U.S. Pat. Nos. 5,298,715 and 5,948,286, which are herein incorporated by reference.

The word "gold" is defined be pure gold (100% Au). The phrase "gold-based" (as it is used to modify a material or element, such as a gold-based electrical conductor, gold-based wire, etc.) is defined to include not only pure gold (100% Au), but also dilute alloys of gold that consist essentially of gold (e.g., 99.995% Au) plus highly-controlled amounts of added trace elements (e.g., Be, Cu, Ca, Y, Ce, Sc, La, Ag, In, Pt, or Pd), which are commonly used to improve strength, ductility, and toughness. These dilute gold alloys are also commonly known as "beryllium-stabilized gold" or "copper-stabilized gold".

The phrase "gold-based" is also defined to include alloys of gold with non-trace amounts of one or more alloying elements, not to exceed 50% by weight (i.e., at least 50% pure gold by weight). An example is gold plus 0 to 5% (by weight) of palladium, silver, platinum, silicon, or germanium, or combinations thereof. Another example is gold plus 2% (by weight) of palladium, available from Tanaka Denshi Kogyo, Japan. Other examples include the gold alloys described in U.S. Pat. Nos. 5,945,065 and 6,213,382, which are herein incorporated by reference.

Gold-based wires can have a diameter of 0.7–2 mils (1 mil=0.001 inches), with the most common diameter being 1 mil. Alternatively, gold-based wires can have a diameter less than 0.7 mil. The word "wire" as it refers to the gold-based electrical conductor is defined to include not only conductors having a circular cross-section, but also those having a rectangular cross-section (e.g., ribbons). Gold-based ribbons used for electrical interconnects are commercially available with a thickness ranging from 0.00025 inches to 0.003 inches, and having a width ranging from 0.002 inches to 0.025 inches.

The phrase "gold-based" is also defined herein to include a coating of pure gold or gold alloy deposited on a conducting substrate. Examples of conducting substrate materials include copper, nickel, and aluminum.

The phrase "gold coating" is defined herein to include a gold coating made by any of the following gold deposition processes: electrolytic plating (e.g., sulfite or cyanide baths), electroless plating, sputtering, evaporation, CVD, PACVD, PECVD, screen printing of fine pastes, and dispensing of fine pastes.

The phrase "eutectic-capable gold-based" (as it modifies a material or element, such as a gold-based electrical conductor or gold-based wire) is defined as any gold-based material (as defined above) capable of forming a liquid eutectic phase with either silicon or germanium.

FIG. 1C shows an isometric view of a schematic electrical interconnection between a microelectronic device and a gold-based conductor, according to a first embodiment of the present invention. Microelectronic device 1 comprises a silicon surface 2. Gold-based electrical conductor 3 has been has been compression bonded directly to silicon surface 2 with compression bond 4, wherein the bond between conductor 3 and silicon surface 2 does not contain one or more materials selected from the group consisting of aluminum, titanium, solder, conductive adhesive and conductive polymer. The materials used for the electrical interconnection, gold and silicon (or germanium), are naturally resistant to chemical attack by HF and HCl acids, which are used as MEMS release etchants.

Figure 1D:
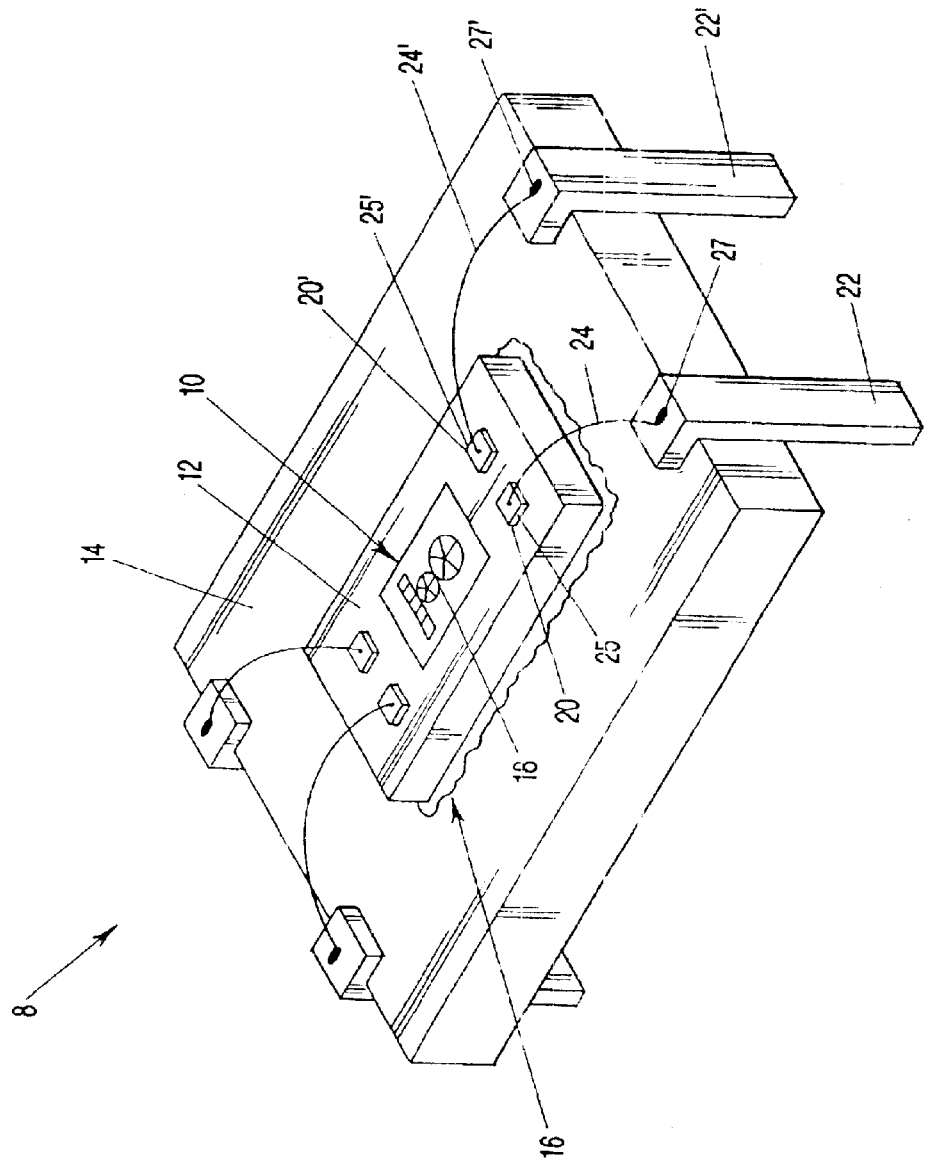
FIG. 1D shows an isometric view of a schematic packaged MEMS device, according to an embodiment of the present invention.

FIG. 1D shows an isometric view of a schematic packaged MEMS device, according to an embodiment of the present invention. Package 8 comprises MEMS device 10 fabricated on silicon die 12. Die 12 has been die attached to package substrate 14, and MEMS device 10 has been electrically interconnected to electrical lead(s) 22. MEMS device 10 may be fabricated using a multi-level polycrystalline silicon surface micromachining process (e.g., SUMMiT-V™). The SUMMiT-V™ (Sandia Ultra-planar, Multi-level MEMS Technology) process is described in greater detail in U.S. Pat. Nos. 5,804,084 and 6,082,208, which are herein incorporated by reference. In the SUMMiT-V™ (or SUMMiT-IV™) process, after one or more MEMS devices have been fabricated on a single, large-diameter silicon wafer, the wafer is diced or singulated into individual die(s) 12 having one or more surface-fabricated MEMS device(s) 10 located on the top side. Silicon die 12 is then die attached to package substrate 14 using a die attach layer 16 (e.g., silver-filled, conductive epoxy adhesive). Package substrate 14 may be made of an electrically insulating material, such as: plastic, glass, metal, ceramic, cermet, or glass-ceramic material, including Low-Temperature Cofired Ceramic (LTCC), High Temperature Cofired Ceramic (HTCC), alumina, aluminum nitride, glass, sapphire, and beryllium oxide. Additional packaging steps (not shown) could be performed on the assembly shown in FIG. 1D, for example: probe testing for functionality; encapsulating the wirebonds in an epoxy or polymer protective over-coating; polymer underfilling, encapsulating or injection molding the lead frame in plastic, and/or attaching a cover lid, with, or without, a transparent window or aperture (not shown).

MEMS device 10 comprises one or more polysilicon MEMS structures 18 (e.g., surface micromachined gears, comb drives, electrostatic comb elements, shutters, thermal actuators, mirrors, cantilever beams, pivots, sliders, ratchets, etc.) that can "move" (e.g., translate, rotate, deflect, or vibrate) after being released by acid etching. MEMS structures 18 move in response to electrostatic and electromagnetic forces created by applied voltages and currents. These voltages and currents are applied through electrical connections with one or more highly-doped polysilicon bonding pads 20 that are disposed on the surface of die 12 (e.g., layer Poly-4 in SUMMiT-V™). Bonding pads 20 are electrically connected, as needed, to the appropriate corresponding MEMS structures 18 that require application of electrical voltage or current. Polysilicon bonding pads 20 may be doped with n-type or p-type dopants, and/or trace elements, such as phosphorus or boron, to increase their electrical conductivity so that they easily conduct electricity. Bonding pad 20 may be electrically connected internally to a vertical polysilicon stack (not shown), which is laterally connected by patterned polysilicon traces located inside MEMS device 10 and, hence, to other conducting layers (e.g., to the heavily-doped "poly-0" level, as used in the SUMMiT-V™ process).

In FIG. 1D, bonding pad 20 is electrically interconnected via gold-based wire 24 to electrical lead 22 mounted on package substrate 14. Electrical lead 22 may be a conductive metal (such as copper or nickel) that is coated with gold. Lead 22 can also be a thick-film or thin-film gold or gold alloy circuit trace in a LTCC package or a lead frame in a plastic package. Wire 24 may be an aluminum or copper wire that is gold-coated. Wire 24 is joined at the proximal end to silicon pad 20 with a ball bond 25, and then joined at the distal (i.e., corresponding) end to electrical lead 22 with a wedge bond 27. Alternatively, bond 25 may be a wedge bond. In this embodiment, MEMS device 10 may be released, unreleased, or released-then-protected (e.g., with parylene vapor-deposited coating). Bond pad 20 is illustrated in FIG. 1D as having a square shape, but other shapes, such as a circle, hexagon, or rectangle, may be used instead. Bond pad 20 can have a thickness of approximately 2 microns, and can have a width of approximately 100 microns.

FIGS. 2A–2D show a cross-section view of progressive stages of fabricating a schematic gold-silicon thermosonically ball-bonded electrical interconnection, according to an embodiment of the present invention. These figures sequentially illustrate the steps used to make the bond. Here, polysilicon bonding pad 20 is disposed on top of substrate 19, and has a silicon surface 2. Substrate 19 may be, for example, a doped region on a silicon wafer with integrated circuits (IC) fabricated thereon, or a polysilicon layer in a surface micromachined MEMS device. One or more thin layer(s) 13 of oxide, contaminants, or deliberately added film(s) (e.g., SAM films) may be present on top of silicon surface 2. Substrate 19 may be supported by heated stage 31.

Figure 2A:
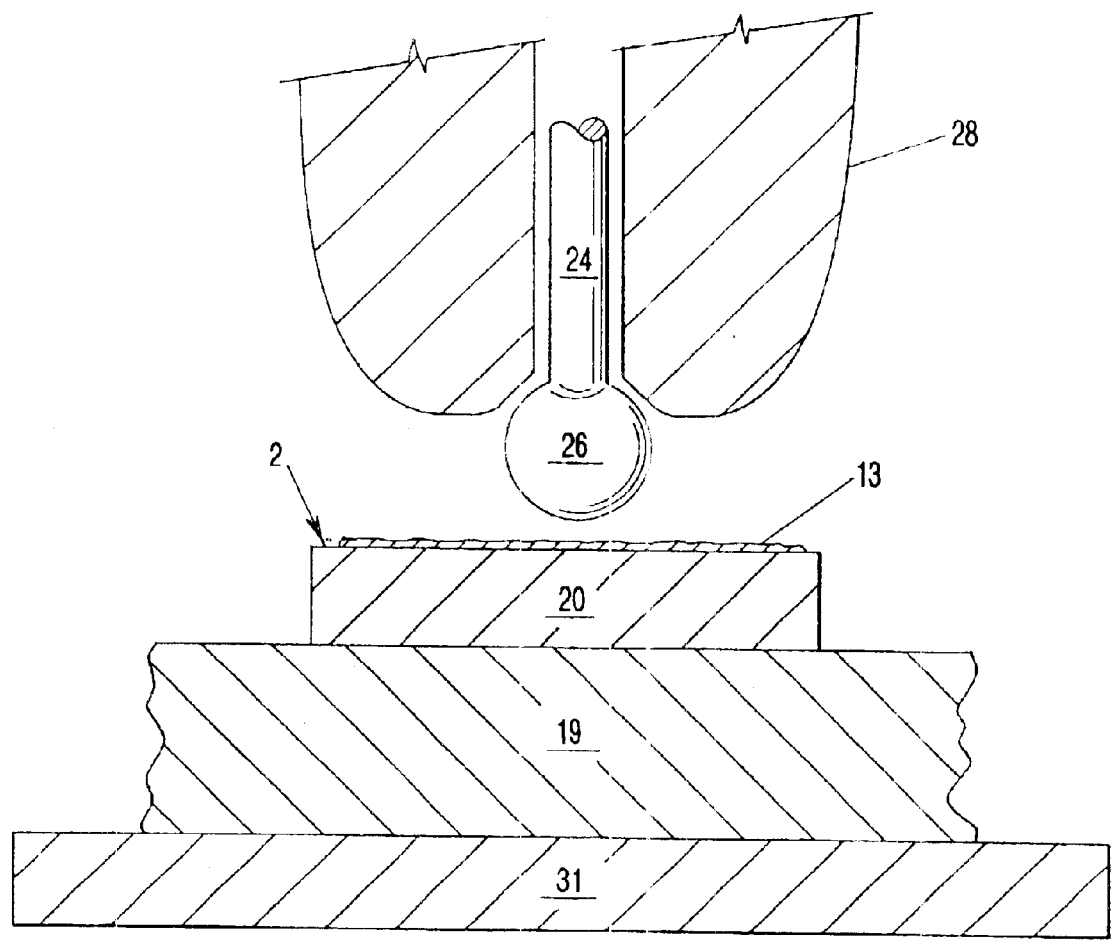
FIG. 2A shows a cross-section view of a schematic gold-silicon thermosonically ball-bonded electrical interconnection, prior to thermosonic bonding, according to an embodiment of the present invention.

FIG. 2A shows a cross-section view of a schematic gold-silicon thermosonically ball-bonded electrical interconnection, prior to thermosonic bonding, according to an embodiment of the present invention. Gold-based wire 24 is held inside of hollow capillary tool 28. Tool 28 may be made of a ceramic, alumina, tungsten carbide, ruby, or other refractory material. The distal end of gold-based wire 24 has an integral, substantially-spherical ball 26 that was formed by melting or "flaming" a free end of wire 24 (e.g., by using an electronic arc, hydrogen flame, or gas torch). The diameter of ball 26 may be 2–5 times larger than the diameter of wire 24 (as is required in military specification MIL-STD-883C). Substrate 19 and bond pad 20 may be pre-heated to in-between 100 C and 225 C prior to bonding by placing substrate 19 on a heated stage 31. Alternatively, substrate 19 and bond pad 20 may be pre-heated to a temperature in-between ambient and 150 C. Alternatively, substrate 19 and bond pad 20 may be pre-heated to approximately 150 C. Alternatively, substrate 19 and bond pad 20 can remain at ambient temperature (i.e., room temperature) and not be pre-heated. Nitrogen gas (not shown) may be used as a cover gas, or sprayed across the surface of heated bond pad 20, to reduce unwanted oxidation of silicon surfaces. Tool 28 may be moved manually, or automatically by a programmed, numerically controlled (NC) machine, to a position directly above bond pad 20 prior to bonding.

Figure 2B:
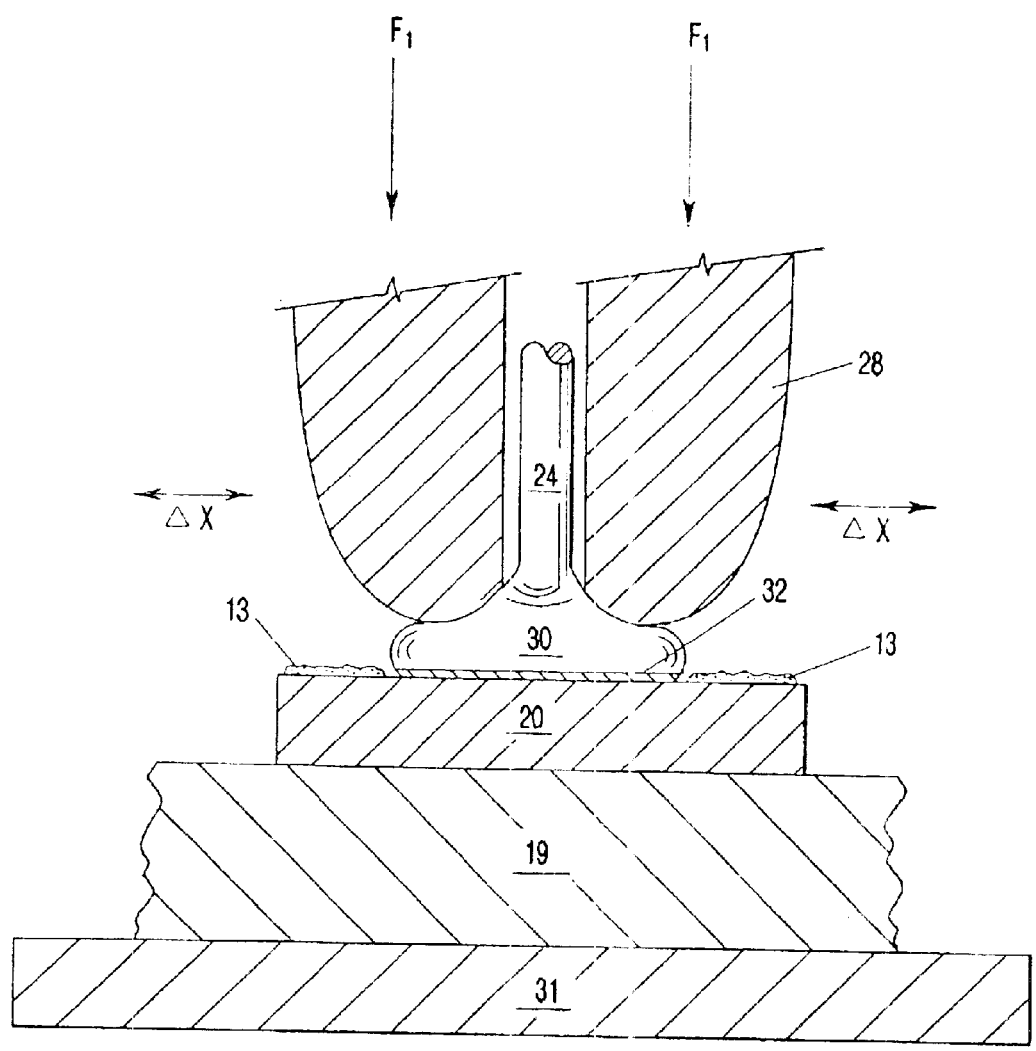
FIG. 2B shows a cross-section view of a schematic gold-silicon thermosonically ball-bonded electrical interconnection, during thermosonic bonding, according to an embodiment of the present invention.

FIG. 2B shows a cross-section view of a schematic gold-silicon thermosonically ball-bonded electrical interconnection, during thermosonic bonding, according to an embodiment of the present invention. In FIG. 2B, after the desired pre-heat temperature has been reached and stabilized, capillary tool 28 has pushed ball 26 down onto bond pad 20 by applying a compressive force, $F_1$, having a magnitude sufficient to deform and "squash" ball 26 into a plastically deformed shape 30 (i.e., compressed or flattened shape). The compressive force may be in the range of 20–300 grams. Alternatively, the compressive force may be in the range of 30–50 grams. Deformed ball 30 can have a flattened shape with a geometry ranging anywhere from a pumpkin to a pancake, depending on the degree of compression achieved. Plastic (i.e., permanent) deformation of ball 26 during application of the compressive force increases the mating contact area for conducting electricity, and also promotes intimate contact between the two mating (faying) surfaces, which improves bonding.

During all, or part, of the ball deformation step in FIG. 2B an ultrasonic generator (e.g., piezoelectric actuator or transducer) vibrates a ceramic or metal capillary tool 28 (holding spherical ball 26) back-and-forth a distance equal to $\Delta X$ in one or more directions that are parallel to the surface being bonded at a frequency from 20–240 KHz (usually 60 KHz). The direction(s) of vibration may be unidirectional, bi-directional, orbital, circular, or random. The amplitude of vibration $\Delta X$ may be on the order of a few microns displacement. The time period during which conventional ultrasonic vibration motion is applied may be in the range of 5–20 ms. The ultrasonic vibration motion helps to mechanically "activates" the bonding process by agitating, rubbing, and/or scrubbing the two surfaces against one another (in addition to the compression force).

This mechanical scrubbing action and compressive force breaks up and disrupts any thin, native oxide layer (e.g., silicon dioxide) in layer 13 that may be present on "clean" silicon surface 2. The thin, native oxide layer may be as thick as 0.2 microinches, or greater for oxidized silicon. Other contaminants that may be present in layer 13 (e.g., organic films, oil, dust, etc.) can also be disrupted, expelled, and/or removed by the ultrasonic vibration. Organic contamination on the surface, especially bond-degrading halogens, can originate from many sources, including: outgassing products from epoxy or other polymer die attach materials, photoresist, residual cleaning solvents or small particles of human contamination such as skin, hair or spittle. Breakup and disruption of the oxide and/or contaminant layers "activates" the surface, thereby enabling metallurgical bonding to occur, unhindered by the presence of a continuous layer of oxide and/or contaminants.

Layer 13 may also comprise deliberately applied films, such as anti-stiction films, lubricants, SAM (Self-Assembled Monolayer) films, metallic films (Ti, Pd, Cr, W, Au, Ni, etc.). These deliberately-applied films may be applied for reasons unrelated to making the electrical interconnection, for example, anti-stiction films applied to MEMS structures, which may be coincidently applied to bonding pad 20). Alternatively, thin metallic films (e.g., gold, in the thickness range of 100 A angstroms to 1000 angstroms) may be applied to bonding pad 20 to control oxidation and/or to promote adhesion. Layer 13 can comprise a combination of these thin layers (e.g. a native oxide layer covered by a SAM film or Au film).

The combination of high compressive stresses and plastic deformation, coupled with simultaneous ultrasonic scrubbing, applied to deformed gold ball 26 by capillary tool 28 is sufficient to create intimate physical contact between gold ball 26 and polysilicon pad 20. If layer 13 is present, then a sufficient amount of the area of layer 13 should be disrupted, expelled, or broken up during thermosonic bonding to permit at least some intimate physical contact between Au and Si. Therefore, the thickness and mechanical properties of layer 13 should not be too thick or too strong to prevent the minimum necessary breakup or disruption of layer 13 to permit at least some intimate physical contact between Au and Si. This also applies for thermocompression bonding and ultrasonic bonding (i.e., compression bonding).

An estimate of the compressive stress applied by capillary tool 28 may be calculated by dividing the applied force (20–300 grams) by the final bonded area of the deformed ball 30. This calculation results in a compressive stress of at least 10,000 psi (and potentially greater than 25,000 psi), which is sufficiently large to plastically deform and squash ball 26. In fact, the initial compressive stress is much higher (as given by the Hertzian contact stress) when ball 26 initially makes contact with pad 20, since the contact area is much smaller before ball 26 has been deformed (stress equals force divided by area), by as much as a factor of 2–4.

Ultrasonic vibration during bonding (e.g., in FIG. 2B) also generates heat by friction due to the two surfaces sliding past each other. This process inherently increases the temperature of the interface during ultrasonic vibration, which further aids the diffusion bonding process. A temperature rise ($\Delta T$) as large as 300 C has been reported in the literature during ultrasonic wedge-bonding of aluminum wires (which is generally performed at room temperature). The longer the period of ultrasonic vibration, the greater the temperature rise will be caused by friction-generated heat at the interface.

A thin reaction layer 32 may be formed at the interface between Au and Si (or Ge) surfaces as the result of thermosonic/compression boning.

Figure 2C:
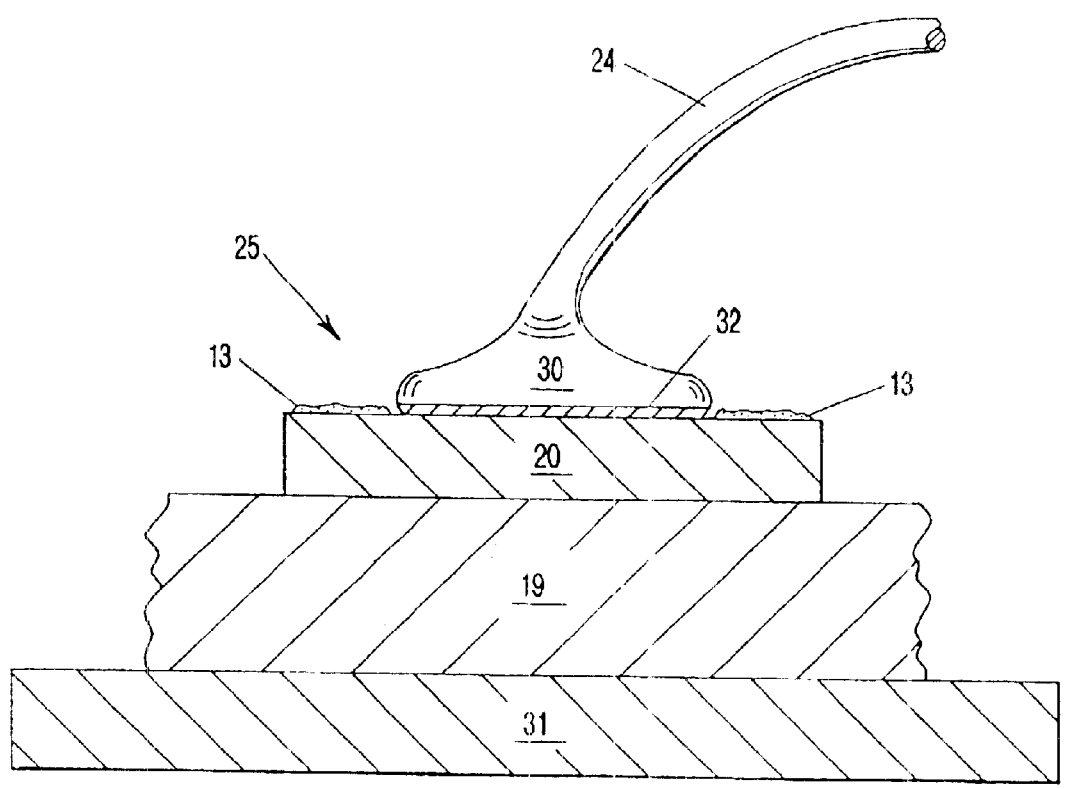
FIG. 2C shows a cross-section view of a schematic gold-silicon thermosonically ball-bonded electrical interconnection, after thermosonic bonding, according to an embodiment of the present invention.

FIG. 2C shows a cross-section view of a schematic gold-silicon thermosonically ball-bonded electrical interconnection, after thermosonic bonding, according to an embodiment of the present invention. In FIG. 2C, after deformed ball 30 has been initially thermosonically ball-bonded to bond pad 20 to create first ball bond 25, capillary tool 28 feeds out gold-based wire 24 and then moves to a corresponding second bonding location on package 8 (see FIG. 1D). At this second location, a wedge bond 27 is made using similar thermosonic bonding action, thereby completing both ends of the electrical interconnection. Typically, second bond 27 is made to a gold-coated electrical lead 22 or to a gold bonding pad (not shown) on package 8.

Thermosonic ball or wedge bonding is conventionally performed on IC's using a programmable, automated machine, which can produce as many as 4–8 thermosonic wirebonds per second. Hence, the application of compressive force and ultrasonic vibration typically occurs in a time period around 5–20 ms, when using modern automated machines. Therefore, we define a prolonged or extended period of ultrasonic vibration to be longer than 20 ms.

Figure 2D:
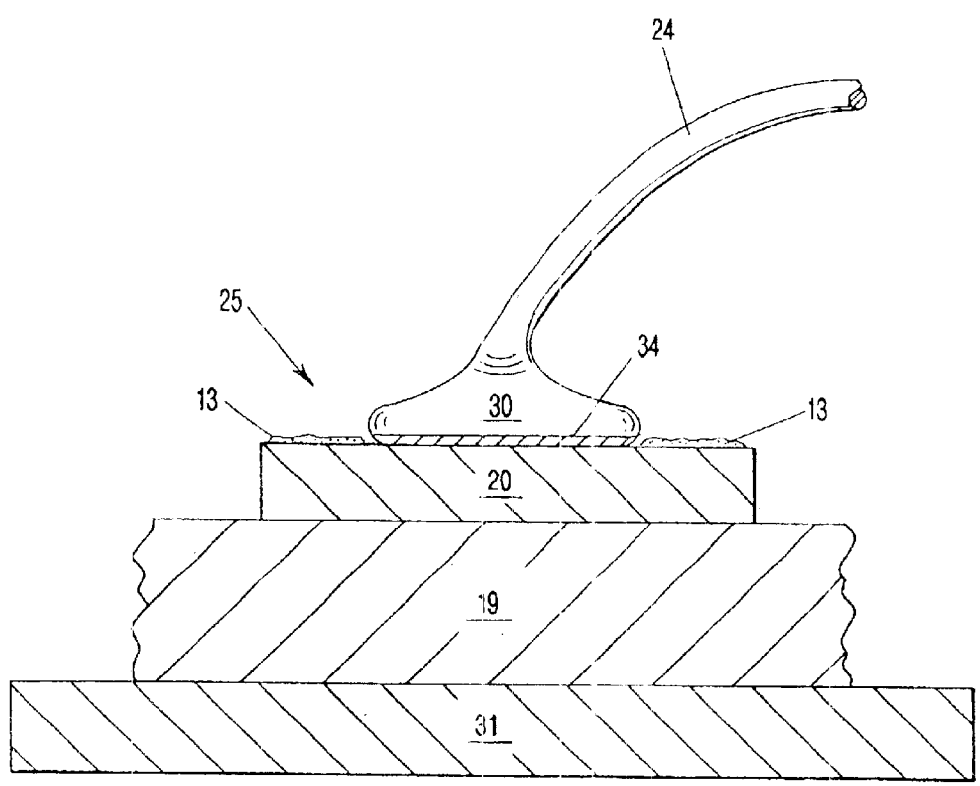
FIG. 2D shows a cross-section view of a schematic gold-silicon thermosonically ball-bonded electrical interconnection, after post-joining heat treatment, according to an embodiment of the present invention.

FIG. 2D shows a cross-section view of a schematic gold-silicon thermosonically ball-bonded electrical interconnection, after post-joining heat treatment, according to an embodiment of the present invention. In FIG. 2D, the strength of the initially thermosonic ball bond 25 shown in FIG. 2C is subsequently increased and enhanced by heat treating bond 25 after the initial thermosonic bond has been made. The heat treatment process enhances the properties of the initially thin reaction layer 32 that was previously formed at the interface between gold and silicon during the initial thermosonic bonding process. The process of heat treating creates an enhanced reaction layer 34. The improvement in bond strength due to heat treating may be in the range from 30% to 100%, or, it may be greater than 100%, depending on time and temperature.

Figure 3:
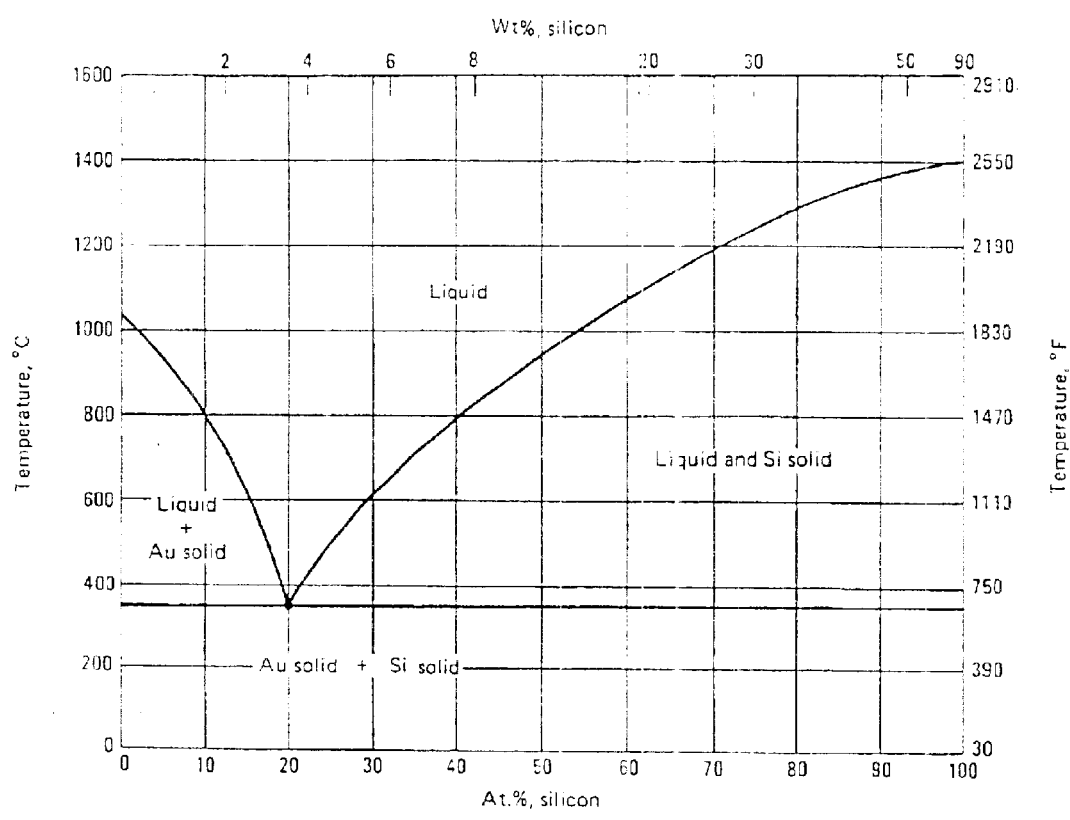
FIG. 3 shows the gold-silicon phase diagram, having a Au-3Si eutectic composition with a melting point of 363 C.

The choice of heat treatment temperature, $T_{HT}$, may be divided into two, mutually exclusive regimes, Regime I, and Regime II. In Regime I, $T_{HT}$ is less than $T_{eutectic}$. In Regime II, $T_{HT}$ is greater than or equal to $T_{eutectic}$. We define $T_{eutectic}$ as the temperature where the metallurgical combination of silicon (or germanium) and the gold-based material initially forms a liquid or molten state, i.e., the eutectic phase. The word "eutectic" refers to the liquid (i.e., molten) state at its lowest temperature (e.g. freezing point). For pure gold and pure silicon, a eutectic phase forms at about 363 C having a composition of gold plus 34 wt % silicon (e.g., Au-3Si). Herein, the phrase "gold plus about 3 wt % silicon" means that the percentage of silicon lies in the range of about 3 wt % to about 4 wt % Si. This is illustrated in FIG. 3, which shows the binary phase diagram for various gold-silicon compositions. In terms of atom percentage, the Au—Si eutectic phase occurs at about 20 atom % silicon and 80% gold. FIG. 3 shows a eutectic temperature being equal to about 363 C. However, older references have reported it to be as high as 370 C. A choice of heat treating temperatures ($T_{HT}$) greater than 370 C (e.g., $T_{HT}$=390–400 C) may be used to provide a comfortably safe thermal margin for ensuring formation of the liquid eutectic phase during post-joining heat treatment, and for overcoming any barriers to initiation of the eutectic reaction that might be caused by the presence of residual oxides or contaminants at the interface (e.g., from incomplete mechanical scrubbing action).

The binary phase diagram (FIG. 3) supports a eutectic temperature for pure Au and Si being equal to about 363 C. For dilute gold alloys (containing trace elements), the eutectic temperature may be slightly different than 363 C. However, for gold alloys containing non-trace alloying elements (e.g. Au-2% Pd), the eutectic temperature of the ternary phase (e.g. Au—Si—Pd) may vary by a greater amount from 363 C. Hence, we define the word "eutectic temperature" to include melting point temperatures other than 363 C for compositions where the gold includes one or more non-trace alloying elements.

Likewise, the eutectic temperature for Au—Ge is 361 C, having a eutectic composition of Au-12% Ge (weight %).

After heat treating in Regime I, enhanced reaction layer 34 can comprise a mixture of gold and silicon (or germanium) atoms created by the solid-state diffusion (interdiffusion) of the two species at a temperature below $T_{eutectic}$ (i.e., in the first regime). In this case, a gradient in the concentrations of Au in Si, and of Si in Au, may be formed throughout layer 34.

After heat treating in Regime II, enhanced reaction layer 34 can additionally comprise a re-solidified eutectic phase containing Au and Si (i.e., re-solidified after cooling down from above $T_{eutectic}$). For example, the re-solidified eutectic phase can comprise Au-3% Si. The thickness of enhanced reaction layer 34 may be about 1 mil (0.001 inches, or, may be thicker than 1 mil, depending on the length of time that the bond is held above the eutectic temperature.

In Regime I, where $T_{HT}$ is below 363 C, solid-state diffusion across the interface can enhance the bond strength.

In Regime II, where $T_{HT}$ is greater than or equal to $T_{eutectic}$ (e.g., 363 C for Au-3Si or 361 C for Au-12Ge), formation of a molten layer having an eutectic composition reforms the initial thermosonically bonded interface and creates a brazed metallurgical bond. The liquid (molten) eutectic phase can flow and infiltrate any gaps, spaces, voids or imperfections in the initial thermosonically bonded interface, as it dissolves silicon from the silicon side and gold from the gold side. The re-solidified layer 34 provides enhanced strength, thermal conductivity, and electrical conductivity across the bond.

The length of time (i.e., the heat treatment time) that the bond is held at the heat treatment temperature $T_{HT}$ depends on the choice of temperature regime (i.e., above or below 363 C). Also, the longer the holding time at $T_{HT}$, the greater the increase in bond strength. However, excessive exposure can cause undesirable overaging and bond weakening (to be discussed later). An optimum heat treatment time may be experimentally determined by measuring the shear strengths of gold-based ball-bonds to a silicon substrate after heat treating to various combinations of time and temperature (See Experimental Results, below).

In Regime I, longer periods of time are needed (as compared to Regime II) to achieve a sufficient amount of thermal diffusion. Generally, the relationship between time and temperature for thermal diffusion phenomena follows the well-known Arrhenious equation. For example, a holding time of 30 minutes may be used when heat treating at 350 C. Alternatively, a holding time of 1 hour may be used when heat treating at 300 C. Alternatively, a holding time of 24 hours may be used when heat treating at 225 C. The combination of time and temperature needed to achieve a proper amount of thermal diffusion should be that which is sufficient to produce a significant amount of increase (e.g., greater than 50%) in the bond strength (as compared to the strength of the initially thermosonically ball bonded interconnect without any post-joining heat treatment).

In Regime II, shorter periods of time may be used (as compared to Regime I) to create the molten eutectic phase and to allow for sufficient wetting, capillary flow, growth of the molten layer, and infiltration of gaps, voids, etc. to occur. The combination of time and temperature for heat-treating the thermosonically bonded Au—Si bond in Regime II can comprise holding the parts at $T_{HT}$ in-between 400 and 450 C for less than one minute. Alternatively, the bond may be held at approximately 400 C for about, one minute. Alternatively, the bond may be held at in-between 363 C and 400 C for more than one minute.

Alternatively, the bond may be held at a temperature greater than the eutectic temperature of a liquid eutectic phase comprising the gold-based conductor material and silicon (or germanium) for a time sufficient to significantly improve the bond's strength.

In general, in Regime II the higher the temperature above the eutectic temperature of 363 C, the shorter the time needed to form a sufficient thickness of eutectic phase. Here, we define a "sufficient thickness" as that thickness of enhanced reaction layer 34 comprising the eutectic phase needed to achieve a significant improvement (e.g., greater than 50%) in the mechanical strength of the thermosonically bonded interconnection (as compared to the strength of a baseline thermosonically ball or wedge-bonded interconnection without having performed any post-joining heat treatment).

When heat treating in Regime II (and to a lesser extent in Regime I), overaging of the bond should be avoided. If an optimum combination of heat treatment time and temperature in Regime II is exceed by a sufficiently large margin, then the volumetric extent of the eutectic phase reaction could propagate and extend completely through deformed ball 30 and up into wire 24. This "averaging" effect could lead to a reduced strength of wire 24 at the shoulder where wire 24 joins ball 30 (a high stress point). Accurate process control of time and temperature during heat treating in Regime II can prevent potential problems with averaging. For example, the heat treatment process may be controlled to prevent the eutectic phase from extending more than 50% of the height of the deformed ball 30.

Figure 4:
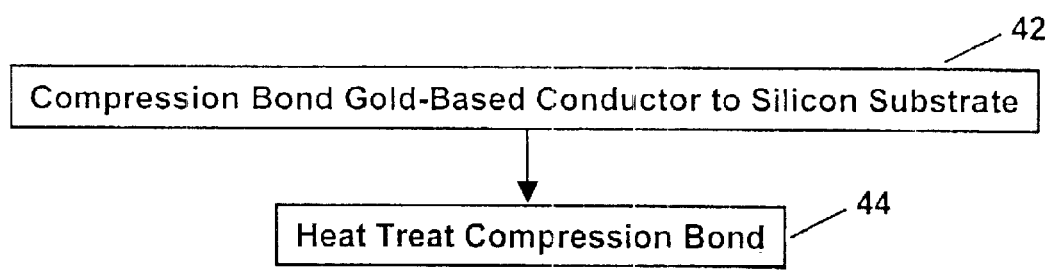
FIG. 4 illustrates a first example of a method for making a gold-silicon electrical interconnection, according to the present invention.

FIG. 4 illustrates a first example of a process for making a gold-silicon electrical interconnection, according to the present invention. A non-oxidizing cover gas, such as nitrogen or helium, may be used during one or more steps in the process to prevent silicon oxidation. Alternatively, one or more of the process steps may be performed in a vacuum; a low-pressure, non-oxidizing environment; or a reducing environment (e.g. hydrogen gas), or a combination of both (e.g., 4% hydrogen gas in nitrogen gas). First, in step 42, a gold-based electrical conductor is compression bonded directly to a silicon substrate, without using one or more intermediate layers selected from the group consisting of aluminum, titanium, solder, conductive adhesive, or conductive polymer disposed in-between the conductor and the silicon substrate. The conductor may be an electrode, ball, bump, wedge, lead, plate, or wire; made of gold, a gold-based material, or a conductive metal coated with gold. Then, in step 44, the compression bonded bond is heat treated to increase its bond strength. The heat treatment temperature in step 44 may be less than 363 C (i.e., Regime I), or greater than or equal to 363 C (i.e. Regime II), as explained above.

Optionally, prior to performing step 42, the silicon surface of the silicon substrate may be dipped or otherwise applied (e.g. sprayed, spun-coated) in a solution containing HF or HCl acid to pre-clean the surface and reduce any oxides (thin $SiO_2$, thick $SiO_2$, other oxides) that may be present. The quick acid dip (e.g., 1–5 seconds) may be followed by a water rinse. Additionally, a thin flash of gold may be applied (e.g., by sputtering or evaporation) on to the clean silicon surface prior to compression bonding the gold-based electrical conductor.

Figure 5:
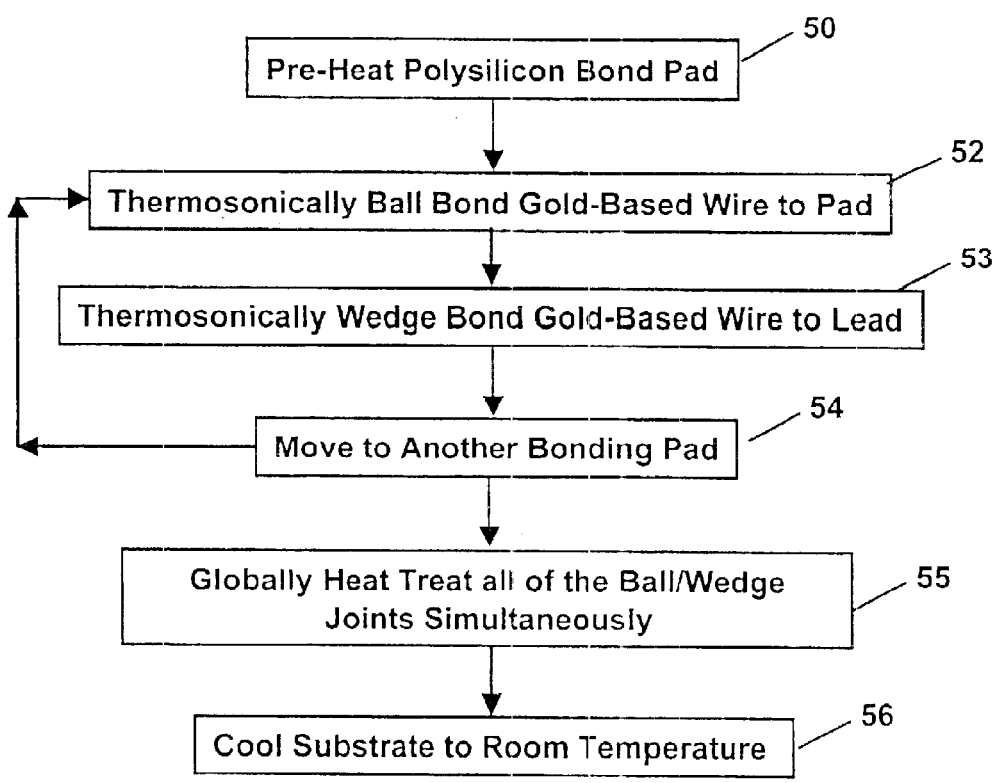
FIG. 5 illustrates a second example of a method for making multiple gold-silicon wire bonded electrical interconnections to a single silicon substrate, according to an embodiment of the present invention.

FIG. 5 illustrates a second example of a process for making multiple gold-silicon wire bonded electrical interconnections on a single silicon substrate, according to the present invention. Referring back to FIG. 1D, a plurality of wirebonded interconnections (e.g. four) are shown, comprising pairs of ball and wedge bonds (25 and 27; 25' and 27', etc.). In the process of FIG. 5, the first step 50 is to pre-heat polysilicon bond pad 20 (e.g., to approximately 100–225 C). Alternatively, bond pad may be pre-heated to about 150 C. This may be accomplished by placing package 8 on heated stage 31, which uniformly heats package substrate 14, silicon die 12, MEMS device 10, and bond pads 20 to the desired pre-heat temperature (e.g., 150 C). Then, in step 52, gold-based wire 24 is thermosonically ball-bonded to polysilicon bond pad 20. This is followed in step 53 by making the corresponding $2^{nd}$ thermosonic wedge bond to electrical lead 22. Next, in step 54, capillary tool 28 (see FIG. 2A) is moved to the next (e.g., adjacent) bonding pad 20' on substrate 12, where the second interconnection is made by making a corresponding pair of ball/wedge bonds 25' and 27' using a second wire 24'. Steps 52–54 are then repeated sequentially as many times as necessary until all of the corresponding pairs of ball/wedge interconnects have been made between MEMS device 10 and package 8. Then, in step 55, the entire assembly (i.e., package 8, including all of the initially wirebonded interconnects) is simultaneously (i.e., globally) heat treated by heating the entire assembly and, then, holding it at the desired heat treatment temperature, $T_{HT}$, for the specified holding time. Global heat treatment in step 55 may be accomplished, for example, by increasing the temperature of heated stage 31 (that was used previously in step 50 to pre-heat the substrate). For example, the temperature of heated stage 31 may be increased from 150 C to about 420 C during step 55. Alternatively, package 8 may be cooled off to room temperature after making all of the wirebond interconnections, then probe testing may be performed (optional), and then (assuming all the connections are acceptable), moving package 8 to an oven or furnace at 420 C (or, back on to heated stage 31, but where stage 31 is now at a higher temperature than before, e.g., 420 C). Other methods for heating package 8 may be used, including: rapid surface heating using high-power infrared lamps (e.g. quartz lamps or vortek lamps), scanning laser beams, or hot gas spray. Finally, in step 56, substrate 12 is cooled back down to room temperature.

Alternatively, other packaging steps may be performed simultaneously along with the heat treatment step in step 55, such as: performing a hermetic cover lid sealing or window attachment (at, for example, 420–450 C with a frit glass or braze alloy); or joining a lid at about 320 C with a AuSn combo lid. Alternatively, a glass cover lid (i.e., cap) may be attached simultaneously during heat treatment in step 55 by anodically bonding the glass lid to the silicon substrate (also known as field assisted bonding or glass capping).

Figure 6:
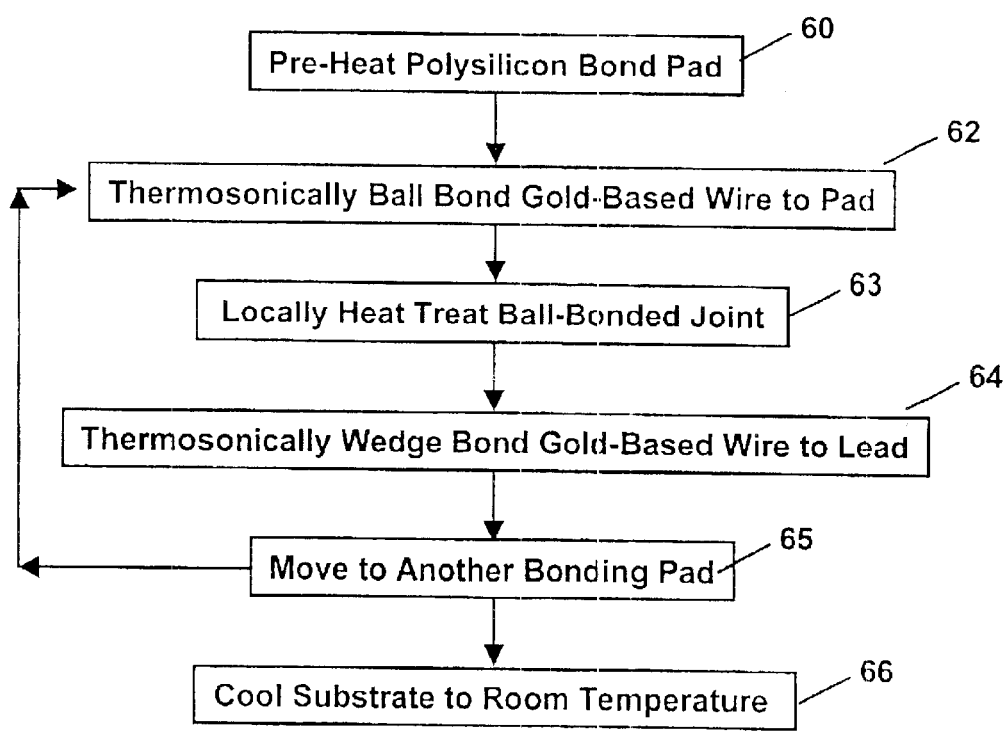
FIG. 6 illustrates a third example of a method for making multiple gold-silicon wire bonded electrical interconnections to a single silicon substrate, according to an embodiment of the present invention.

FIG. 6 illustrates a third example of a method for making multiple gold-silicon wire bonded electrical interconnections on a single silicon substrate, according to the present invention. Referring back to FIG. 1D, a plurality of wirebonded interconnections (e.g., four) are shown, comprising pairs of ball and wedge bonds (25 and 27; 25' and 27', etc.). In the process of FIG. 6, the first step 60 is to pre-heat polysilicon bond pad 20 (e.g., to 100–225 C). This may be accomplished by placing package 8 on heated stage 31, which uniformly pre-heats package substrate 14, silicon die 12, MEMS device 10, and bond pad 20 to the desired pre-heat temperature (e.g., 150 C). Then, in step 62, gold-based wire 24 is thermosonically ball bonded to bond pad 20 to make bond 25. Next, in step 63, the same, identical ball bond 25 that was just made in previous step 62 is locally heat treated at the desired heat treatment temperature, $T_{HT}$. This may be accomplished by applying a localized source of heat directly to ball bond 25. Next, in step 64, after local heat treatment, the corresponding $2^{nd}$ thermosonic wedge bond to electrical lead 22 is made. Then, in step 65, capillary tool 28 is moved to the next bonding location (e.g., pad 20') on substrate 12. Then, steps 62–64 are repeated as many times as necessary until all of the interconnects have been made and locally heat-treated. Finally, in step 66, substrate 12 is cooled back down to room temperature. Note that it is not necessary to locally heat treat the second wedge bond 27 made to lead 22 because this involves an Au—Au bond.

Figure 7:
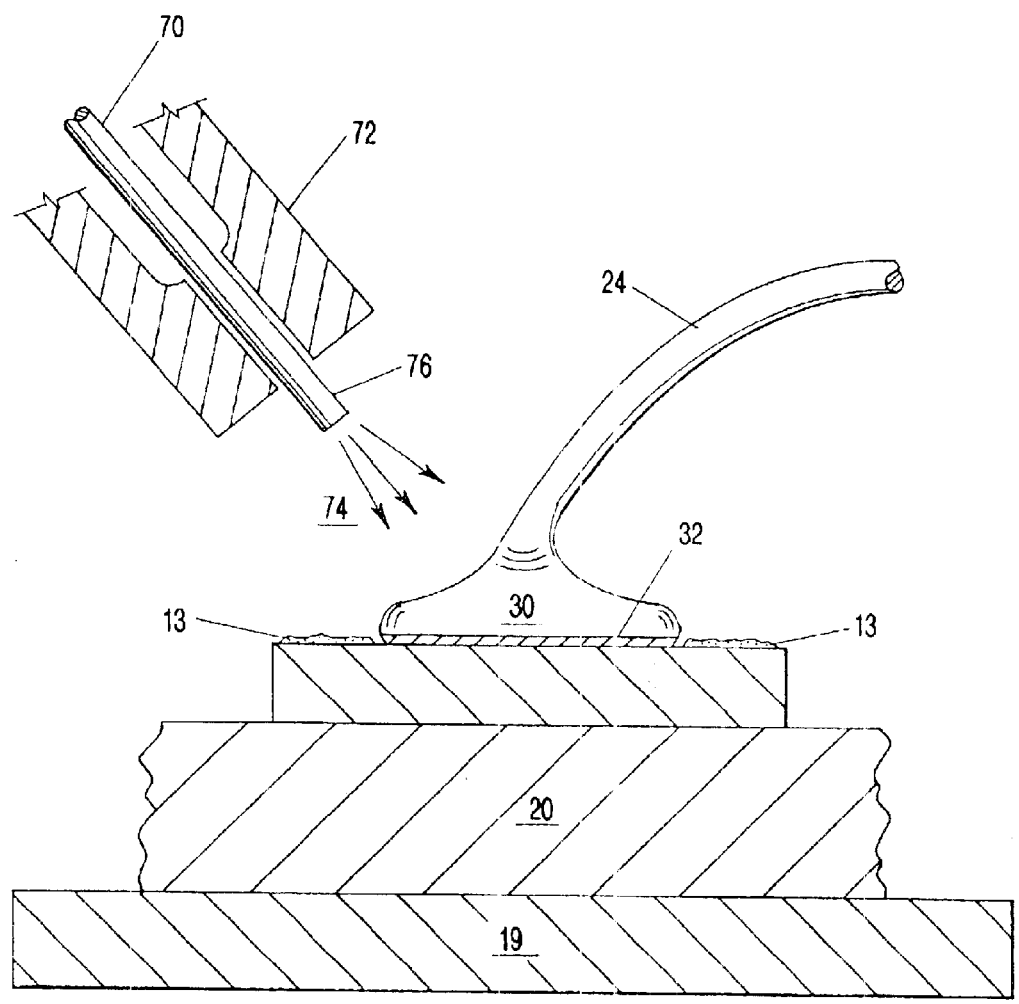
FIG. 7 shows a schematic cross-section side view of a gold-silicon ball bonded electrical interconnection locally heated by laser light, according to an embodiment of the present invention.

A variety of methods may be used to accomplish local heating of initial bond 25. FIG. 7 shows a schematic cross-section side view of a ball bonded electrical interconnection locally heated by laser light, according to an embodiment of the present invention. Laser beam 74 is guided through an optical fiber 70 that is held in a fiber guide 72, and has a tip 76 that is located close to deformed ball 30. Laser light 74 is directed on to ball 30 (or to a location near ball 30). Alternatively, a pre-heated thermode (e.g., an electrically-heated tip of a tool, like a miniature soldering iron) may be touched against deformed ball 30, where the heat conducts down through ball 30 to the Au—Si interface. Alternatively, the time period for performing the ultrasonic scrubbing action may be extended (e.g., greater than 20 ms) beyond the conventional time period to provide additional friction-generated heat at the interface, resulting in locally increased interface temperatures (as was reported for ultrasonic aluminum wedge bonding). This extended time period may be greater than 0.5 seconds. Alternatively, a hollow, capillary tube (similar to fiber guide 72, but without the fiber optic 70 being held inside) could be placed close to deformed ball 30 and used to spray or direct pre-heated hot gas (preferably, non-oxidizing gas, such as helium or nitrogen) directly towards on ball 30 to locally heat ball 30. Alternative, capillary tool 28 can comprise means for heating attached to tool 28, for example, by electrical resistance heating with a resistance coil (not shown) wrapped around tool 28 or the tool's holder (not shown). In this case, the resistance heating coil may be energized and heated to $T_{HT}$ after ball 30 has been compressed, but before tool 28 has lifted off the surface of ball 30, thereby applying the necessary heat treatment temperature to the bond interface. The compressive force may be reduced during the heat treatment step to a level sufficient to maintain contact between tool 28 and ball 30, but not so large as to continue to compress ball 30.

In the process illustrated in FIG. 6, locally heating each individual deformed ball 30 one at a time in step 63 requires less total heat input (as compared to heating the entire mass of package 8 to $T_{HT}$ in step 55 in FIG. 5). Also, the process of FIG. 6 could eliminate the step of placing package 8 in a furnace, which saves time, and reduces handling stresses, exposure to contaminants, etc. Also, the process of FIG. 6 reduces exposure of other components on package 8 to high temperatures, which could be damaging. For example, if die 12 is attached to package 8 with an organic adhesive such as epoxy, then exposure to post-joining heat treatment at relatively high temperatures (e.g. 420–450 C) can damage the adhesive, or can contaminate other sensitive microelectronic components or sensors with products of outgassing released from volatile components in the adhesive. The process of FIG. 6 minimizes this potential problem by confining the volume of material heated to $T_{HT}$ to be as small as possible (i.e., approximately the volume of deformed ball 30 and bond pad 20).

As discussed earlier, heat is generated at the interface due to friction from the mechanical rubbing/scrubbing during ultrasonic vibration in thermosonic bonding. Conventional automatic ball bonding machines are designed to maximize the speed and, hence, minimize the time required to make the ball and wedge bonds. This limits the time during which ultrasonic vibration (i.e., scrubbing) may be applied (e.g., less than 20 ms). However, if this limitation is relaxed, then a longer period of time for ultrasonic vibration (scrubbing) may be chosen to take advantage of this friction-generated heat input. Specifically, the time period for ultrasonic vibration (scrubbing) may be chosen to be long enough to generate a temperature rise at the interface (due to friction) sufficient to exceed 363 C and form the liquid eutectic Au-3Si phase. Although the longer time period for "scrubbing" will increase the total cycle time for making a ball/wedge interconnection (and, hence, reduce the speed and efficiently of the automated operation), this technique of locally heating the Au—Si bond via internal friction can eliminate the need to perform a separate (e.g., batch) heat treatment step.

The temperature rise at the interface may be inherently or intrinsically self-limiting because after the interface has reached the eutectic temperature of 363 C, melting occurs and a liquid film forms at the interface. Once the liquid film forms, friction between the two sliding surfaces essentially disappears and no more heat is generated. This naturally limits the maximum amount of temperature rise in a self-contained fashion, even if ultrasonic vibration action continues after melting. Without the generation of heat from friction, the bond naturally cools down below 363 C and the liquid film then re-solidifies into a solid, enhanced reaction layer 34, which metallurgically brazes ball 30 to pad 20. Hence, as soon as the liquid film forms during ultrasonic vibration, the ultrasonic vibration may be turned off, since no more heat may be locally added by this mechanism (e.g. friction). This self-limiting process variation can prevent undesirable overaging of the bond due to exposure to excessively high heat treatment temperatures and times.

Alternatively, the bond strength developed by the initial thermosonic bond alone may be sufficient (i.e., without subsequent heat treatment), for some applications (e.g., for package 8 that won't be subjected to handling stresses or other potentially harmful packaging steps). Consequently, the heat treatment step after initial thermosonic bonding may be eliminated in this embodiment. For example, ball shear strengths for gold balls thermosonically bonded to a silicon wafer substrate were measured to be in the range of 50–60 grams, without any post-joining heat treatment step.

Figure 8A:
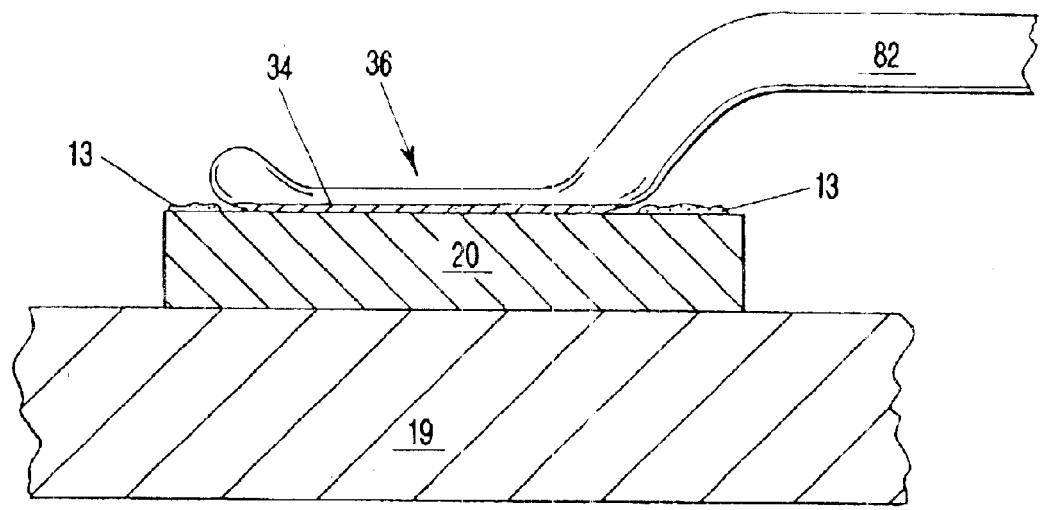
FIG. 8A shows a cross-section view of another example of a schematic gold-silicon thermosonically bonded electrical interconnection, according to an embodiment of the present invention.

FIG. 8A shows a cross-section view of another example of a schematic gold-silicon thermosonically bonded electrical interconnection, according to an embodiment of the present invention. Polysilicon bond pad 20 is located on top of substrate 19. Gold-based conductor 82 is thermosonically bonded to pad 20, with via reaction layer 32 located in-between. Conductor 82 may be a ribbon, beam lead, or a TAB lead (Tape Automated Bonding). The central region 36 of conductor 82 located above pad 20 has been compressed and plastically deformed during thermosonic bonding by a specially-shaped ceramic tool (not shown). Enhanced reaction layer 34 can comprise an enhanced, diffusion-strengthened zone formed by heat treating the initial bond in Regime I (i.e., less than 363 C). Alternatively, enhanced reaction layer 34 can comprise a zone of re-solidified Au-3Si eutectic phase, formed by heat treating the initial bond in Regime II (i.e., greater than, or equal to, 363 C). The heat treatment temperature may be generated by the external application of heat (e.g., via a furnace, laser beam, hot tool, hot gas, etc.), or internally by friction during vibration, or by a combination of internal and external heat sources.

Figure 8B:
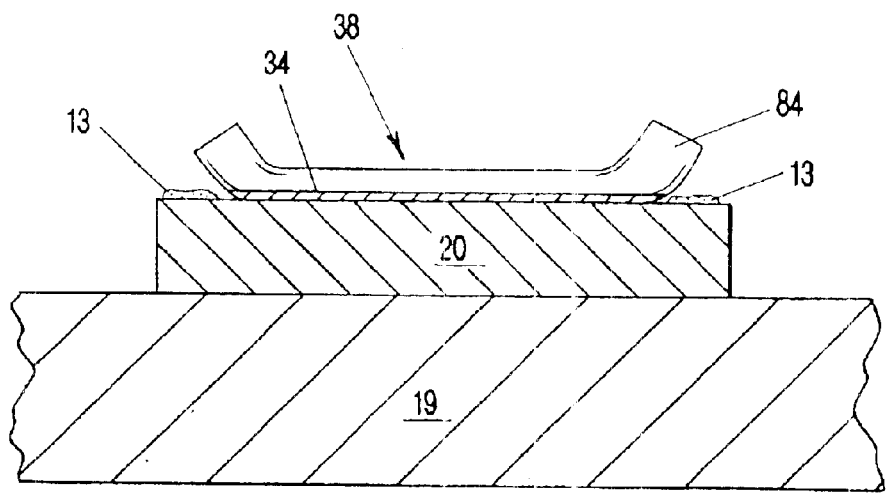
FIG. 8B shows a cross-section view of another example of a schematic gold-silicon thermosonically bonded electrical interconnection, according to an embodiment of the present invention.

FIG. 8B shows a cross-section view of another example of a schematic gold-silicon thermosonically bonded electrical interconnection, according to an embodiment of the present invention. Polysilicon bond pad 20 is located on top of substrate 19. Square gold-based pad 84 is thermosonically bonded to pad 20, including reaction layer 32. The central region 36 of square pad 84 located above silicon pad 20 has been compressed and plastically deformed during thermosonic bonding by a specially-shaped ceramic tool (not shown). Enhanced reaction layer 34 can comprise an enhanced, diffusion-strengthened zone formed by heat treating the initial bond in Regime I (i.e., less than 363 C). Alternatively, enhanced reaction layer 34 can comprise a zone of re-solidified Au-3Si eutectic phase, formed by heat treating the initial bond in Regime II (i.e., greater than, or equal to, 363 C). The heat treatment temperature may be generated by the external application of heat (e.g., via a furnace, laser beam, hot tool, hot gas, etc.), or internally by friction during vibration, or by a combination of internal and external heat sources.

FIGS. 9A–9F show a cross-section view of progressive stages of fabricating a schematic gold-silicon thermosonically ball-bonded electrical interconnection, according to an embodiment of the present invention. These figures sequentially illustrate the steps used to make the bond. Here, silicon bond pad 20 is located on top of substrate 19. Substrate 19 may be, for example, a silicon wafer with integrated circuits (IC) fabricated thereon, or, a polysilicon layer in a MEMS device. The surface of pad 20 can have a layer 13 of oxide, contaminants, or deliberately applied film(s).

Figure 9A:
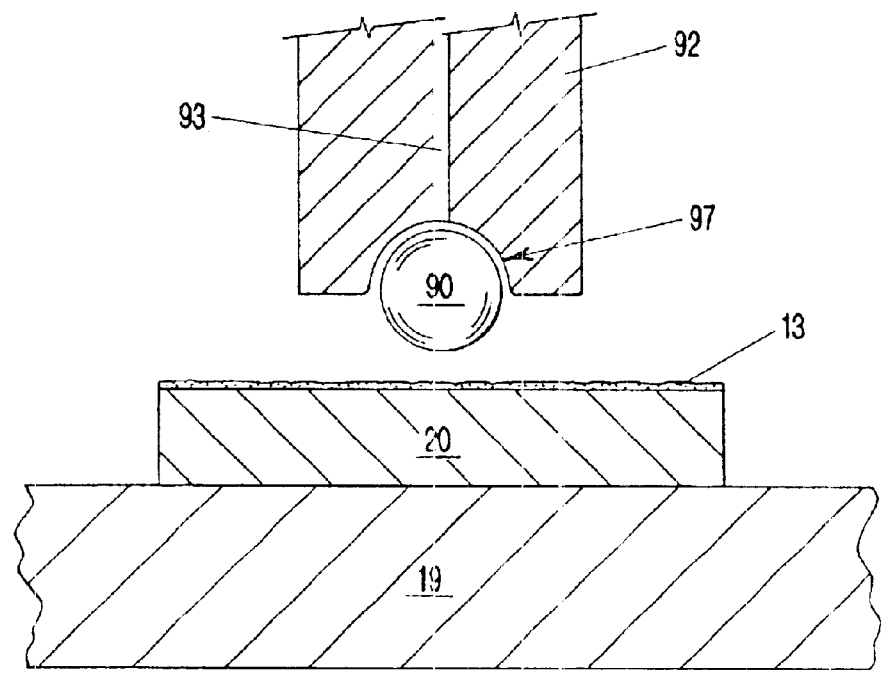
FIG. 9A shows a cross-section view of a schematic gold-silicon thermosonically ball-bonded electrical interconnection, prior to thermosonic bonding, according to an embodiment of the present invention.

FIG. 9A shows a cross-section view of a schematic gold-silicon thermosonically ball-bonded electrical interconnection, prior to thermosonic bonding, according to an embodiment of the present invention. Gold-based ball 90 is held inside of hollow ceramic capillary tool 92. Ball 90 does not have a wire attached to it (unlike FIG. 2A). Tool 92 can have a central hole 93, through which a vacuum may be pulled to lift and hold ball 90 against inner surface 97 of tool 92. Inner surface 97 can have a hemispherical shape that substantially matches the spherical shape of ball 90. Tool 92, holding ball 90, is positioned above bond pad 20 prior to bonding.

Alternatively, with respect to FIG. 9A, ball 90 can (initially) have an integral wire 24 attached to it, the same as shown in FIG. 2A and FIG. 2B. It is possible to program a conventional thermosonic ball-bonding machine to make a ball-bonded bond and then have it cut off (i.e., pinch off) wire 24 at a position very close to ball 26 (i.e., ball 90), so that only a short stub or stem of wire 24 (not shown) sticks out from the top of ball 90 after bonding. This mode of operating the wirebonding machine may be called the "ball-only" mode. This short stub or stem of wire 24 does not interfere with any subsequent bonding steps, and can actually promote compression bonding by providing a smaller contact area for concentrating compressive stresses and plastic deformation.

Figure 9B:
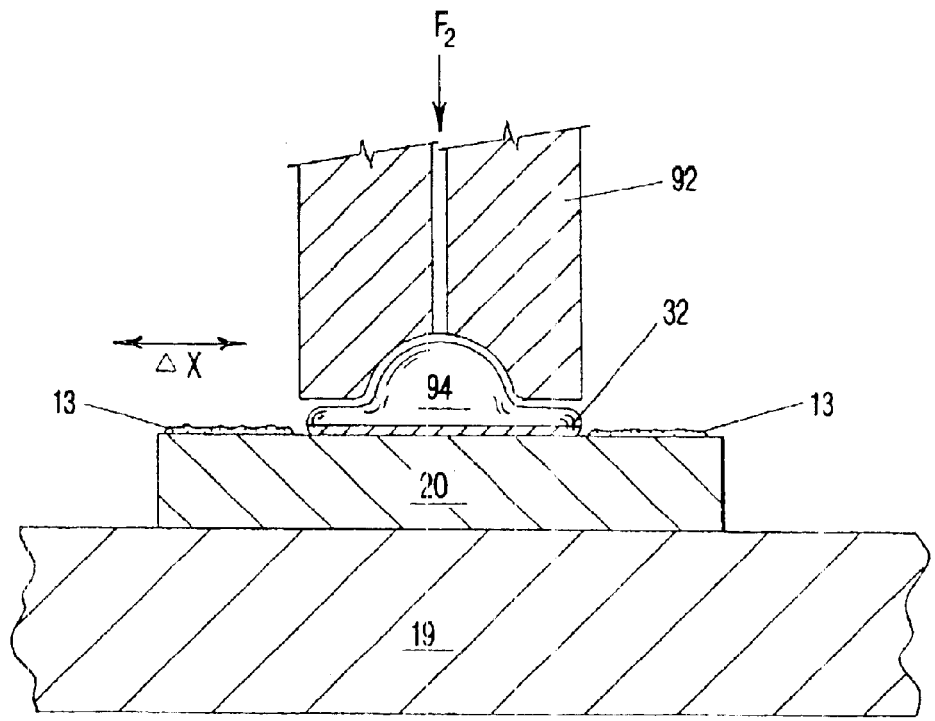
FIG. 9B shows a cross-section view of a schematic gold-silicon thermosonically ball-bonded electrical interconnection, during thermosonic bonding, according to an embodiment of the present invention.

FIG. 9B shows a cross-section view of a schematic gold-silicon thermosonically ball-bonded electrical interconnection, during thermosonic bonding, according to an embodiment of the present invention. A high compressive force, $F_2$, is applied to tool 92, which pushes down and plastically deforms ball 90 into deformed ball 94 as it squashes against pad 20. Substrate 19 may be preheated to about 150 C prior to thermosonic bonding. Simultaneously, tool 92 is ultrasonically vibrated back and forth to mechanically scrub and clean the two mating surfaces, including disrupting layer 13. This creates a gold "bump" 94 on pad 20.

Figure 9C:
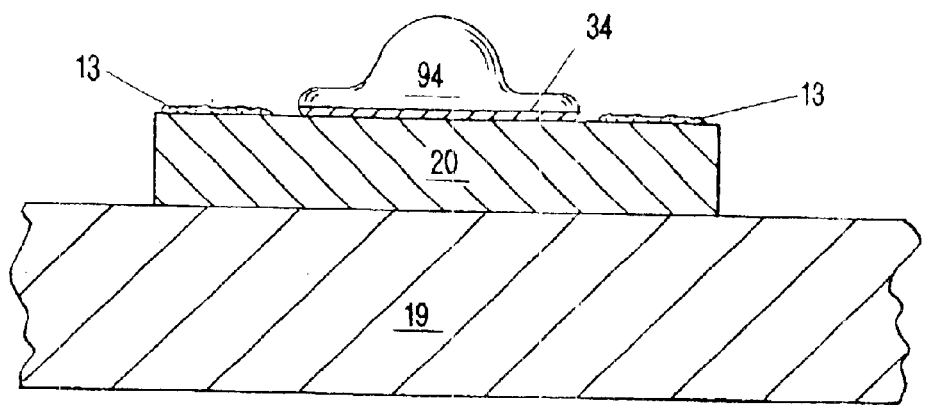
FIG. 9C shows a cross-section view of a schematic gold-silicon thermosonically ball-bonded electrical interconnection, after post-joining heat treatment, according to an embodiment of the present invention.

FIG. 9C shows a cross-section view of a schematic gold-silicon thermosonically ball-bonded electrical interconnection, after post-joining heat treatment, according to an embodiment of the present invention. In FIG. 9C, tool 92 has been removed, and the initial Au—Si bond has been heat treated to enhance the initial reaction layer 32. Enhanced reaction layer 34 can comprise an enhanced, diffusion-strengthened zone formed by heat treating the initial bond in Regime I (i.e., less than 363 C). Alternatively, enhanced reaction layer 34 can comprise a zone of re-solidified Au-3Si eutectic phase, formed by heat treating the initial bond in Regime II (i.e., greater than, or equal to, 363 C). The heat treatment temperature may be generated by the external application of heat (e.g., via a furnace, laser beam, hot tool, hot gas, etc.), or internally by friction during vibration, or by a combination of internal and external heat sources.

Figure 9D:
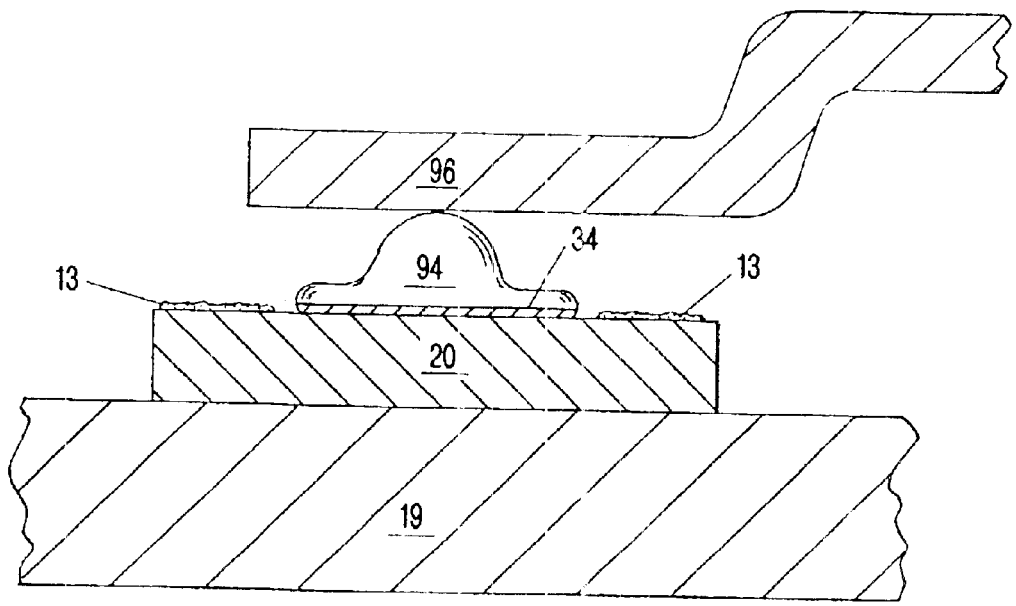
FIG. 9D shows a cross-section view of a schematic gold-silicon thermosonically ball-bonded electrical interconnection, prior to thermocompression bonding, according to an embodiment of the present invention.

FIG. 9D shows a cross-section view of a schematic gold-silicon thermosonically ball-bonded electrical interconnection, before thermocompression bonding, according to an embodiment of the present invention. In FIG. 9D, an electrical conductor 96 is placed in contact with first deformed ball 94 (i.e., bump 94). Conductor 96 may be gold or gold-coated, and may be a wire or ribbon, and can have a square or oval cross-section.

Figure 9E:
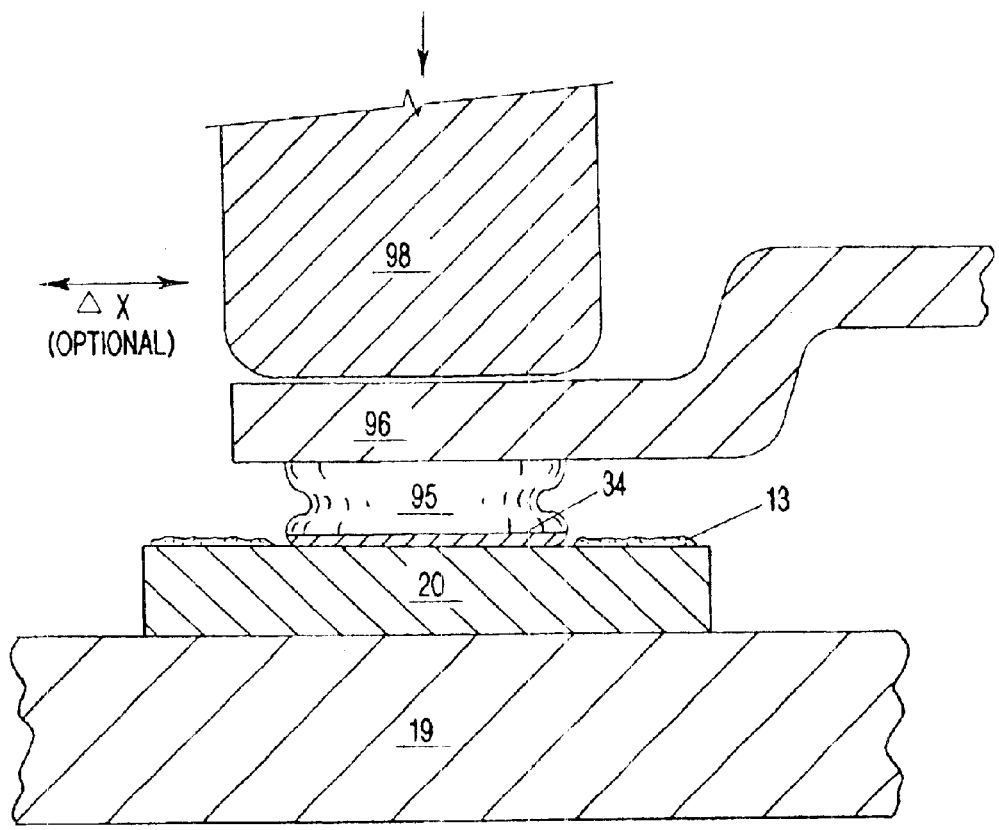
FIG. 9E shows a cross-section view of a schematic gold-silicon thermosonically ball-bonded electrical interconnection, during thermocompression bonding, according to an embodiment of the present invention.

FIG. 9E shows a cross-section view of a schematic gold-silicon thermosonically ball-bonded electrical interconnection, during thermocompression bonding, according to an embodiment of the present invention. In FIG. 9E, a high compressive force, $F_3$, is applied to thermode tool 98, which pushes on both conductor 96 and first deformed ball 94. This process is called thermocompression. Additionally, ultrasonic vibration may be applied, but is not required to make the Au—Au bond. Compressive force $F_2$ promotes diffusion bonding and intimate contact between gold conductor 96 and gold ball 94 by continuing to squash ball 94 into second deformed ball 95. Substrate 19 may be preheated to about 250–350 C prior to bonding in FIG. 9E, or the thermode tool 98 may be preheated to 250–350 C (e.g. by resistance heating).

Alternatively, during the step illustrated in FIG. 9E, the thermode tool 98 may be preheated to a temperature above the Au—Si eutectic temperature, i.e., above 363 C. In this case, no heat treatment above the eutectic temperature would have been performed previously in the step illustrated in FIG. 9C. Consequently, during the thermocompression step in FIG. 9E, with tool 98 heated above the eutectic temperature, the liquid eutectic phase would simultaneously locally form at the interface between bump 95 and pad 20, forming enhanced reaction layer 34. This embodiment eliminates the need to pre-heat the entire assembly to a high temperature (e.g. 420 C). Alternatively, the assembly of FIG. 9C may be preheated to an intermediate temperature below 363 C (e.g., 250 C), and then the additional heat to exceed the eutectic point may be supplied by heated thermode tool 98.

Figure 9F:
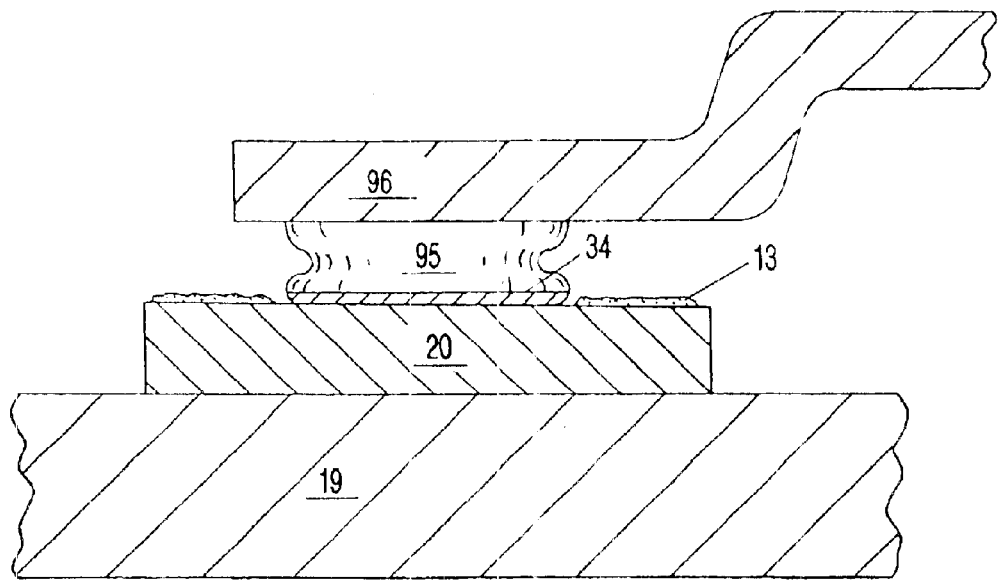
FIG. 9F shows a cross-section view of a schematic gold-silicon thermosonically ball-bonded electrical interconnection, after thermocompression bonding, according to an embodiment of the present invention.

FIG. 9F shows a cross-section view of a schematic gold-silicon thermosonically ball-bonded electrical interconnection, after thermocompression bonding, according to an embodiment of the present invention. FIG. 9F shows the final configuration of the bond.

Figure 10A:
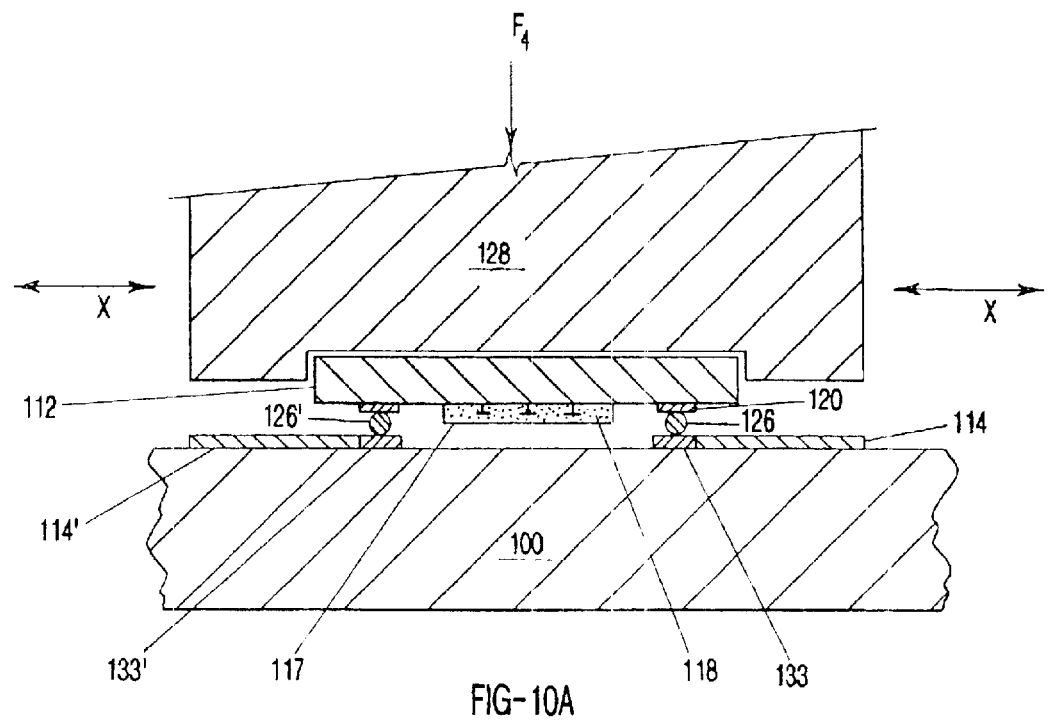
FIG. 10A shows a cross-section view of a schematic gold-silicon thermosonically flip-chip, ball-bonded electrical interconnection, during thermocompression bonding, according to an embodiment of the present invention.

FIG. 10A shows a cross-section view of a schematic gold-silicon thermosonically flip-chip, ball-bonded electrical interconnection, during thermocompression bonding, according to an embodiment of the present invention. In FIG. 10A, insulating substrate 100 comprises electrical conductors 114 and 114' made of a gold-based material. Conductors 114, 114' can comprise thick-film traces that terminate in a square bonding pad 133, 133°, also made of gold. Substrate 100 can comprise an insulating ceramic (e.g. alumina, aluminum nitride, silicon carbide, beryllium oxide, silicon nitride, sapphire), an insulating plastic material, polyimide, or printed wiring board material. MEMS die 112 comprises MEMS structures 118 fabricated on its surface. MEMS structures 118 may be released (not shown) or may be encapsulated in a protective layer 117. Protective layer 117 may be sacrificial silicon dioxide (as is found in unreleased MEMS devices), or, may be a vapor-deposited protective layer, such as parylene, which has been applied after the MEMS structures 118 have been released, but before electrical interconnects have been made.

MEMS die 112 is oriented upside-down in the standard flip-chip configuration, with MEMS structures 118 facing towards substrate 100. Polysilicon bonding pads 120 and 120' are disposed on the surface of MEMS die 112. Gold-based balls 126 and 126' are located in-between pads 120, 120' and gold traces 114, 114', respectively. MEMS die 12 can have as many as 40–100 bond pads, balls, and conductors (not shown in this side view). Ceramic tool 128 holds MEMS device 112 in tight alignment with the pattern of gold bonding pads 133, 133'. Tool 128 may be a vacuum collet design, for holding die 112 via vacuum force. Tool 128 applies high compressive force, $F_4$, to plastically deform balls 126, 126', etc., and applies simultaneous ultrasonic vibration to scrub the mating surfaces. Post-joining heat treatment may be applied to enhance the Au—Si bond, as described above.

Figure 10B:
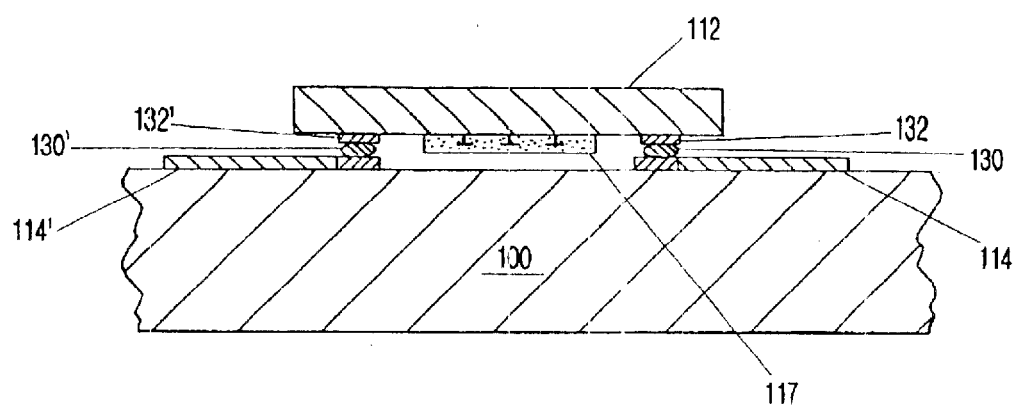
FIG. 10B shows a cross-section view of a schematic gold-silicon thermosonically flip-chip, ball-bonded electrical interconnection, after thermocompression bonding, according to an embodiment of the present invention.

FIG. 10B shows a cross-section view of a schematic gold-silicon thermosonically flip-chip, ball-bonded electrical interconnection, after thermocompression bonding, according to an embodiment of the present invention. FIG. 10B illustrates the packaged MEMS die 112, after being mechanically attached and electrically interconnected in a flip-chip geometry. All of the balls 126, 126' have been simultaneously plastically deformed into deformed balls 130, 130' during thermosonic bonding. Optionally, reaction layers 132, 132' may be enhanced by post-joining heat treatment, as described earlier. The amount of compression (i.e., vertical deflection of balls 130, 130' may be chosen to be greater than the largest mismatch in the set of individual radii of balls 130, 130', so that any tolerance errors in the ball's radii may be accommodated during ball compression by the total, gross vertical deflection. For example, if the individual ball's radii vary by, say, 10%, from ball to ball, then the vertical deflection may be chosen to equal, say, 50% of the ball's radius, which virtually guarantees that all of the balls will make contact with both mating surfaces, and be substantially plastically deformed, despite the variation in individual ball's radii by 10%.

Figure 10C:
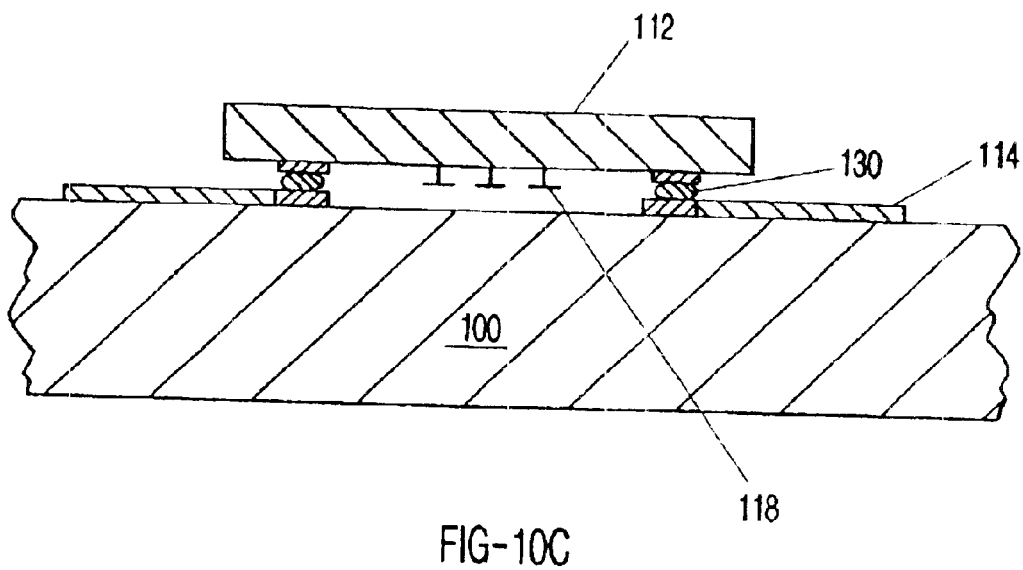
FIG. 10C shows a cross-section view of a schematic gold-silicon thermosonically flip-chip, ball-bonded electrical interconnection, after the MEMS device has been released, according to an embodiment of the present invention.

FIG. 10C shows a cross-section view of a schematic gold-silicon thermosonically flip-chip, ball-bonded electrical interconnection, after the MEMS device has been released, according to an embodiment of the present invention. FIG. 10C illustrates the packaged MEMS die 112, after protective coating 117 has been removed. Removal of coating 117 thereby releases MEMS structures 118, which makes them functional. Coating 117 may be removed by acid etching in HF or HCl acid, if coating 117 comprises silicon dioxide (glass). Alternatively, if coating 117 comprises a vapor-deposited coating, such as parylene, it may be removed by dry plasma etching in a reactive ion (e.g., oxygen) plasma environment. A polymer underfill material may be applied to the region around the electrical interconnections (but not on the released MEMS structures).

Figure 11A:
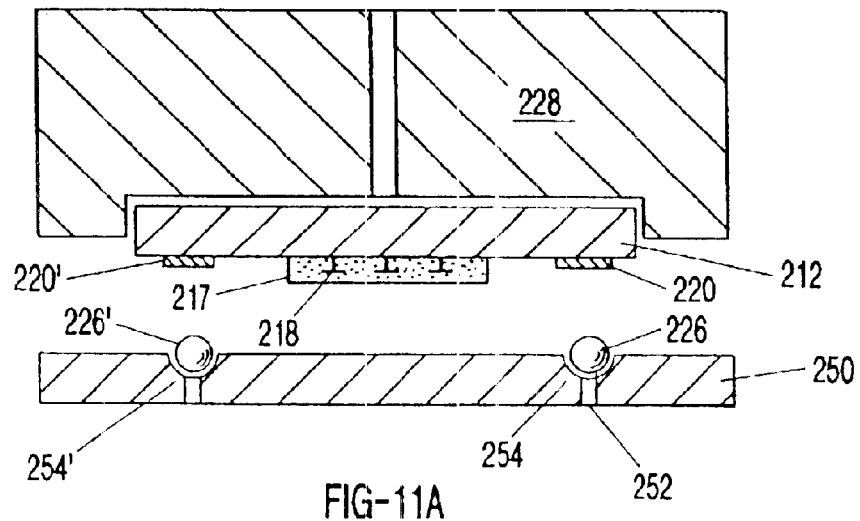
FIG. 11A shows a cross-section view of a schematic gold-silicon thermosonically flip-chip, ball-bonded electrical interconnection, prior to thermosonic flip-chip bonding according to an embodiment of the present invention.

FIG. 11A shows a cross-section view of a schematic gold-silicon thermosonically flip-chip, ball-bonded electrical interconnection, prior to thermosonic bonding according to an embodiment of the present invention. FIG. 11A shows a MEMS die 212 with surface micromachined MEMS structures 218 and polysilicon bonding pads 220, 220'. MEMS die 212 is positioned in the "flip-chip" orientation above alignment fixture 250 with a vacuum-actuated tool 228. Alignment fixture 250 has a plurality of alignment features that hold gold-based balls 226, 226' in a precisely defined pattern, e.g., a square pattern with a fine pitch (40–70 microns). These alignment features can comprise through-hole 252, or hemispherical depression 254. A plurality of balls 226, 226', etc. are placed in alignment features 252, 254. This may be accomplished by vibrating plate 250 inside a box of balls 226. A vacuum may be drawn on the backside of plate 250, which pulls down and holds ball 226 through thru-hole 252.

Figure 11B:
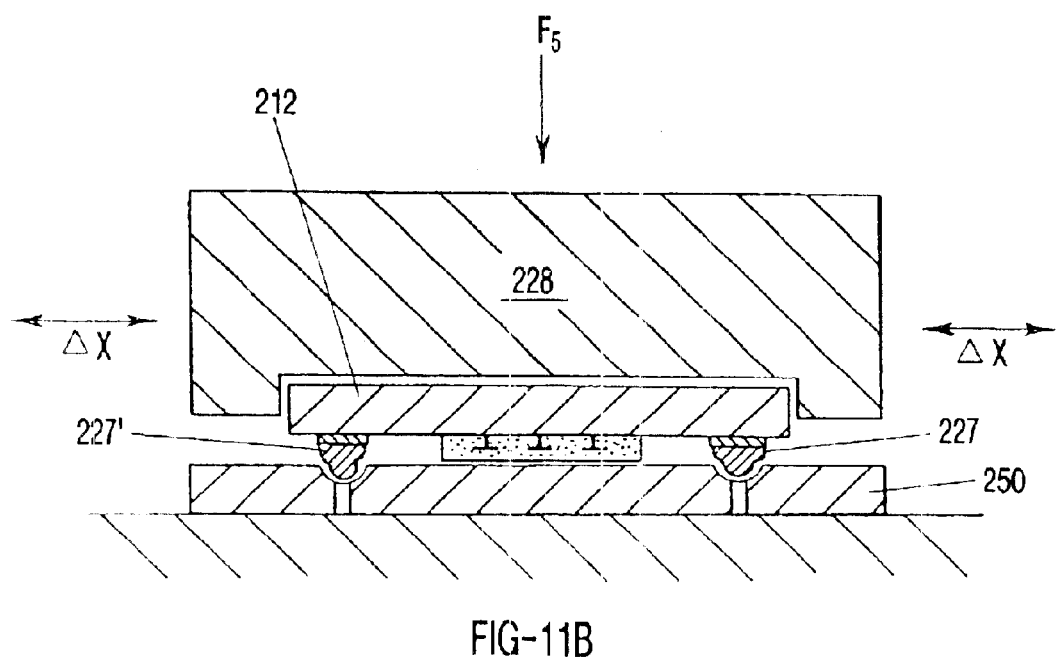
FIG. 11B shows a cross-section view of a schematic gold-silicon thermosonically flip-chip, ball-bonded electrical interconnection, during thermosonic flip-chip bonding according to an embodiment of the present invention.

FIG. 1B shows a cross-section view of a schematic gold-silicon thermosonically flip-chip, ball-bonded electrical interconnection, during thermosonic flip-chip bonding according to an embodiment of the present invention. In FIG. 11B, a high compressive force, $F_5$, is applied to tool 228, which pushes down and partially plastically deforms ball 226 into partially deformed ball 227 (i.e., bump 227) as it squashes ball 226 against pad 220. Simultaneously, tool 228 is ultrasonically vibrated back and forth to mechanically scrub and clean the mating surfaces. All of the balls 226, 226', etc. are simultaneously plastically deformed and vibrated due to tool 228 pushing and vibrating on the backside of MEMS die 212. This creates gold "bumps" 227, 227' on pads 220, 220'.

Figure 11C:
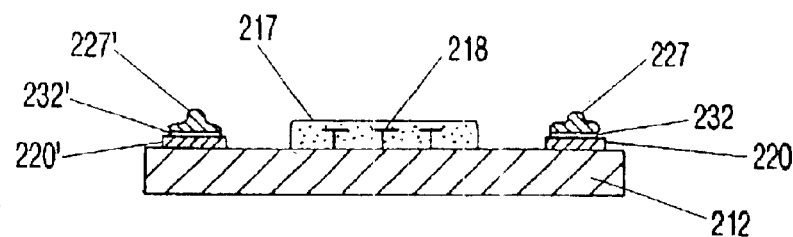
FIG. 11C shows a cross-section view of a schematic gold-silicon thermosonically flip-chip, ball-bonded electrical interconnection, after post-joining heat treatment, according to an embodiment of the present invention.

FIG. 11C shows a cross-section view of a schematic gold-silicon thermosonically flip-chip, ball-bonded electrical interconnection, after post-joining heat treatment according to an embodiment of the present invention. In FIG. 11C, tool 228 is removed. An optional heat treatment step may be performed at this point to enhance reaction layer 232, 232' and improve bond strength, as described earlier. Probe testing to check continuity of the bonds at this point may be performed.

Figure 11D:
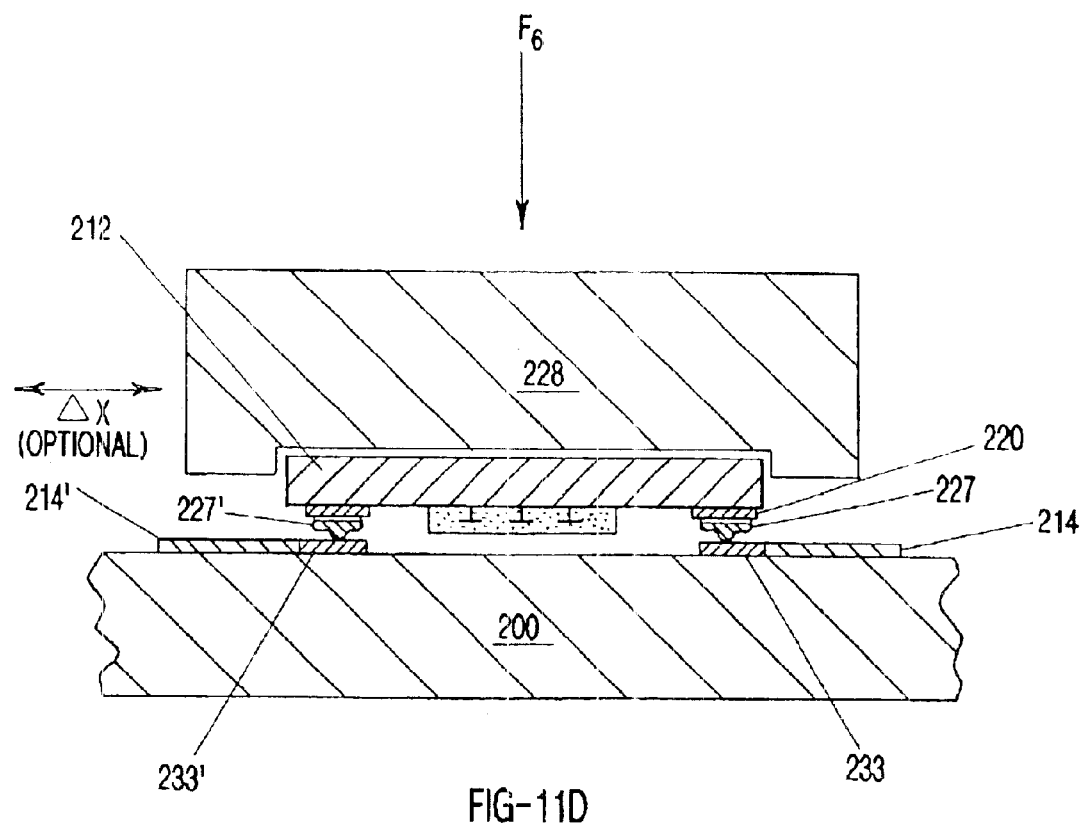
FIG. 11D shows a cross-section view of a schematic gold-silicon thermosonically flip-chip, ball-bonded electrical interconnection, during thermocompression bonding, according to an embodiment of the present invention.

FIG. 11D shows a cross-section view of a schematic gold-silicon thermosonically flip-chip, ball-bonded electrical interconnection, during thermocompression flip-chip bonding according to an embodiment of the present invention. In FIG. 11D, MEMS die 212 is held again in vacuum fixture 228 and positioned above package substrate 200 in close alignment with bond pads 227, 227'. Package substrate 200 may be an insulating ceramic material, such as alumina, silicon nitride, or beryllium oxide; or may be an insulating plastic material, such as printed wiring board material. Electrical conductor 214 is disposed on top of substrate 200. Conductor 214 may be a thick-film or otherwise metallized gold trace. Square, gold or gold-plated bonding pad 233 is also disposed on top of substrate 200, and is electrically connected to conductor 214. Partially-deformed gold-based ball 227 is positioned directly above, and in alignment with, bond pad 233 on substrate 200. Next, a high compressive force, $F_6$, is applied to tool 228, which pushes down and completely deforms partially-deformed ball 227 into completely deformed ball 228 as it squashes ball 227 against pad 223. Optionally, tool 228 may be ultrasonically vibrated back and forth to mechanically scrub and clean the mating surfaces. The use of ultrasonic vibration action is optional because the bond is Au—Au. Hence, the second bond between pad 223 and partially-deformed ball 227 may be made via thermocompression, using, for example, a heated tool 228. All of the balls 227, 227', etc. are simultaneously deformed and compressed from the action of tool 228 pushing (and, possibly, vibrating) on the backside of MEMS die 212.

Alternatively, during the step illustrated in FIG. 11D, tool 228 may be preheated to a temperature above the Au—Si eutectic temperature, i.e., above 363 C. In this case, no heat treatment above the eutectic temperature would have been performed previously in the step illustrated in FIG. 11C. Consequently, during the thermocompression step in FIG. 11D, with tool 228 heated above the eutectic temperature, then during thermocompression the liquid eutectic phase may be simultaneously formed at the interface between bumps 227, 227' and pads 233, 233', forming enhanced reaction layer. Alternatively, the assembly of FIG. 11C may be preheated to an intermediate temperature below 363 C (e.g., 250 C), and then the additional heat to exceed the eutectic point may be supplied by heated thermode tool 228.

Figure 11E:
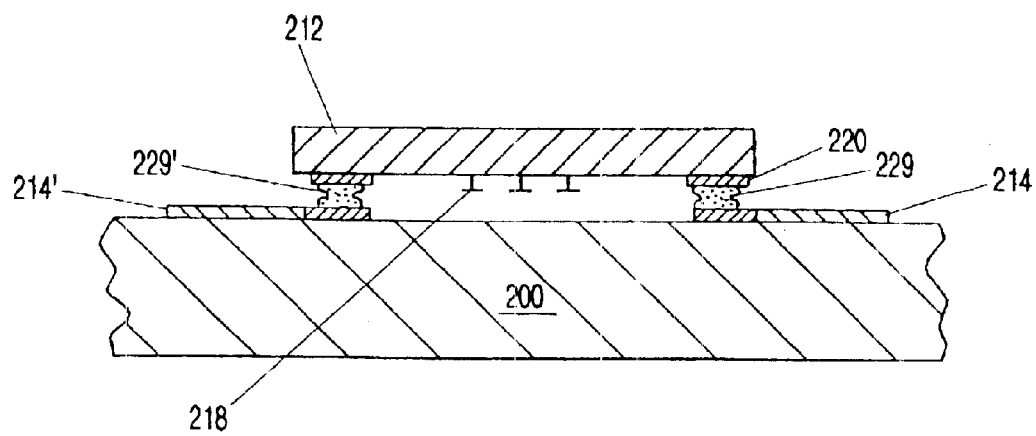
FIG. 11E shows a cross-section view of a schematic gold-silicon thermosonically flip-chip, ball-bonded electrical interconnection, after the MEMS device has been released, according to an embodiment of the present invention.

FIG. 11E shows a cross-section view of a schematic gold-silicon thermosonically flip-chip, ball-bonded electrical interconnection, after the MEMS device has been released, according to an embodiment of the present invention. FIG. 11E shows the final configuration of the packaged MEMS device 212, after being "flip-chip", thermosonically ball-bonded to package substrate 200 and after releasing MEMS structures 218 by removing protective layer 217.

Alternatively, MEMS device 212 may be released by removing layer 217 after the step illustrated in FIG. 11C, and prior to the step illustrated in FIG. 11D. In other words, after gold bumping, but before flip-chip bonding.

Figure 12:
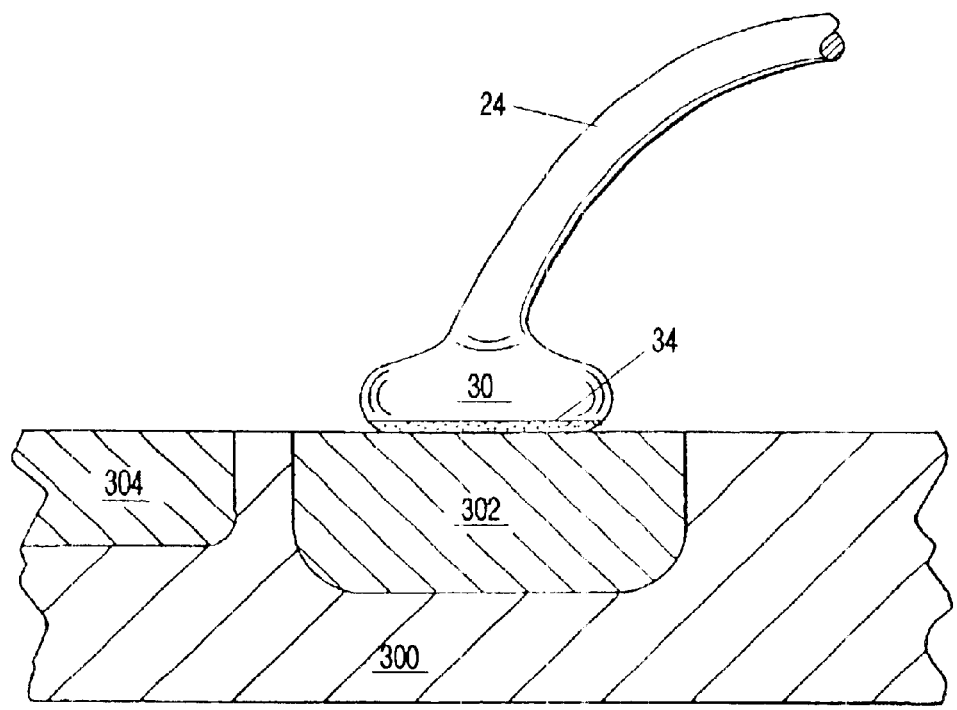
FIG. 12 shows a cross-section view of a schematic gold-silicon thermosonically ball-bonded electrical interconnection, according to an embodiment of the present invention.

FIG. 12 shows a cross-section view of a schematic gold-silicon thermosonically ball-bonded electrical interconnection, according to an embodiment of the present invention. Single crystal silicon wafer 300 (as might be used in conventional semiconductor IC fabrication) comprises doped regions that are used for fabricating microelectronic devices, such as CMOS IC's, DRAM's, CCD chips, etc. These doped regions, (n-type, p-type, phosphorus-doped, boron-doped, lightly-doped, heavily-doped, etc.) are represented schematically by zones 302 and 304 in FIG. 12. Doping may be used to increase the electrical conductivity over that of pure silicon. FIG. 12 shows that deformed gold-based ball 30, with integrally attached gold-based wire 24, has been thermosonically ball-bonded directly to doped silicon region 302 (e.g., phosphorus-doped silicon), without using a polysilicon bond pad 20; and without using an aluminum bond pad, a titanium adhesion layer, solder, conductive adhesive or conductive polymer disposed in-between the gold conductor and the doped-silicon substrate. Alternatively, wire 24 may be attached to doped silicon region 302 via a wedge bond. Optional post-joining heat treatment may be used to enhance the initial reaction layer 32 and, hence, improve bond strength, as previously discussed.

Figure 13:
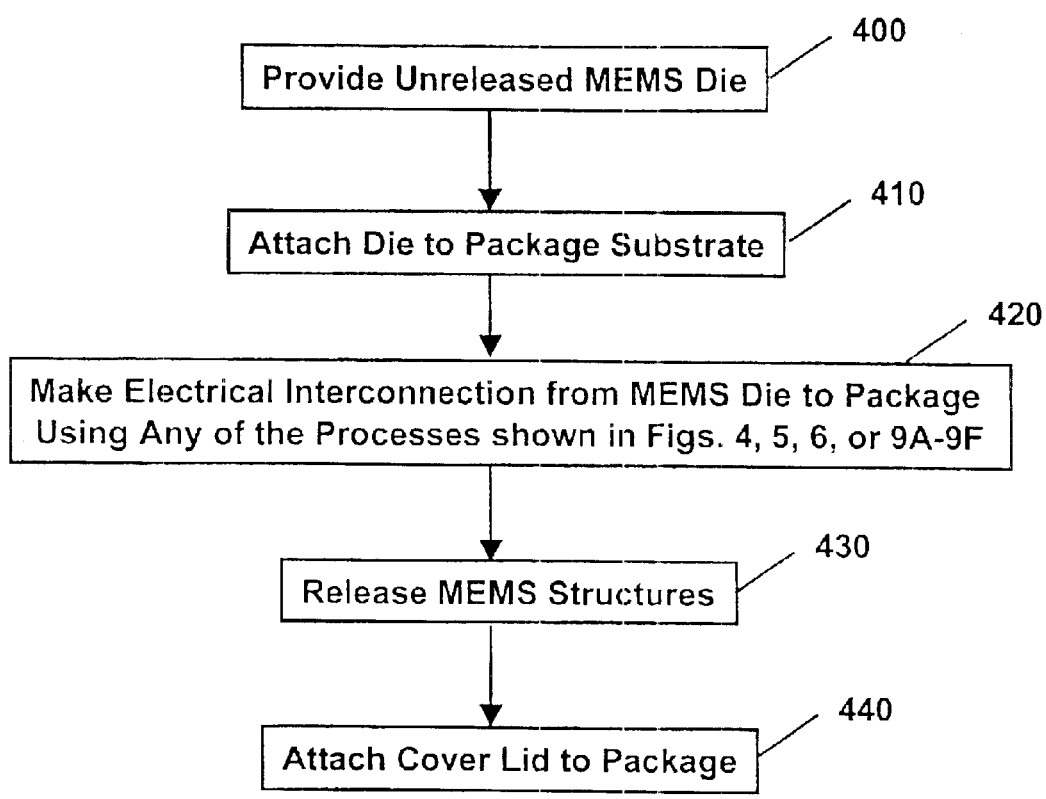
FIG. 13 illustrates a fourth example of a process for packaging a MEMS device, including the process of making a gold-silicon electrical interconnection, according to the present invention.

FIG. 13 illustrates a fourth example of a process for packaging a MEMS device, including the process of making a gold-silicon electrical interconnection, according to the present invention. In step 400, an unreleased MEMS die is provided. Then, in step 410, the die is die attached to a package substrate. Next, in step 420, the MEMS device is electrically interconnected to the package substrate using any of the process described earlier in FIGS. 4, 5, 6, or 9A–9F. Then, in step 430, the MEMS device is released. Last, in step 440, a cover lid is attached to the package.

Alternatively, with reference to the process of FIG. 13, steps 410 and 420 may be combined into a single step (not shown) by using the flip-chip bonding process that is described in FIGS. 10A–10C or 11A–11E.

Figure 14:
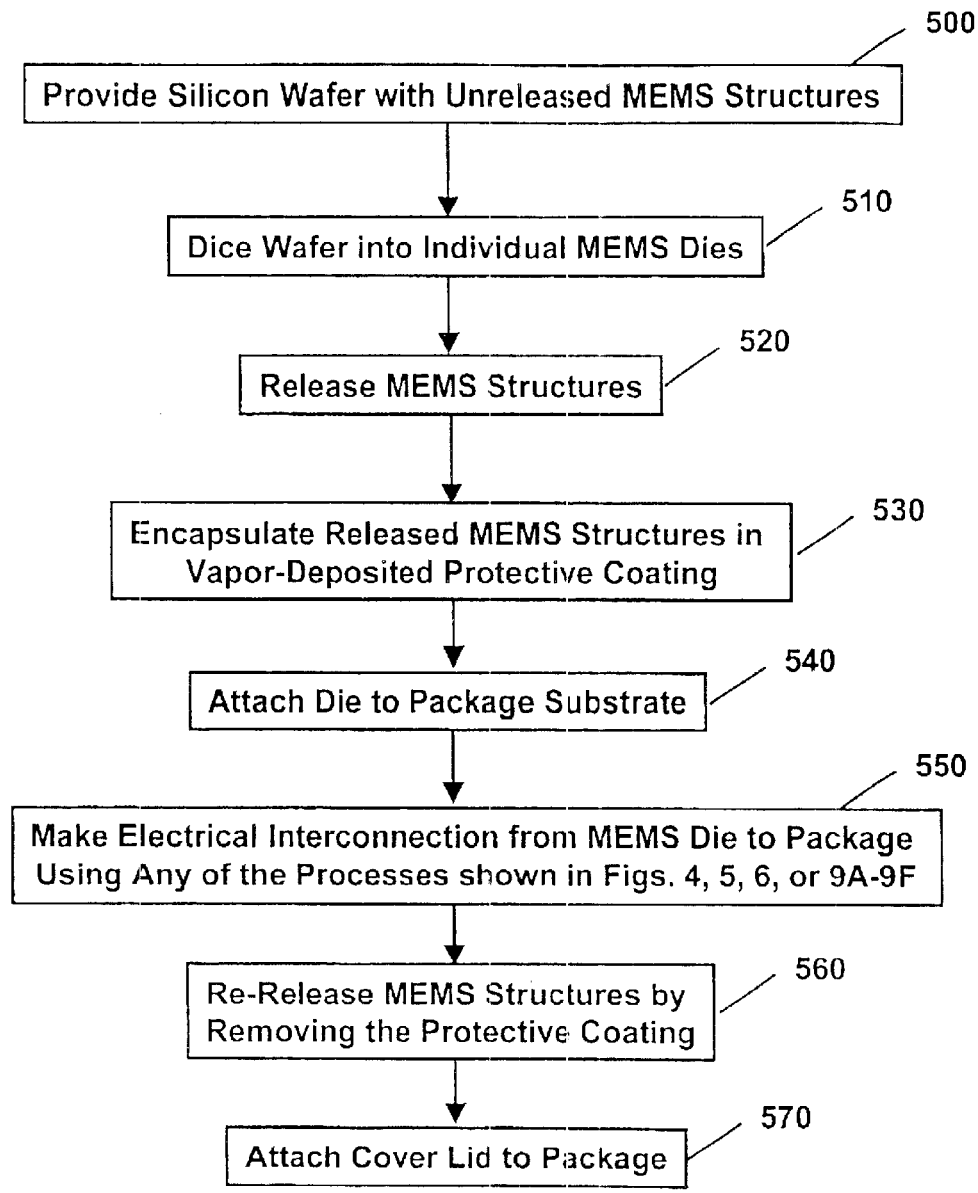
FIG. 14 illustrates a fifth example of a process for packaging a MEMS device, including the process of making a gold-silicon electrical interconnection, according to the present invention.

FIG. 14 illustrates a fifth example of a process for packaging a MEMS device, including the process of making a gold-silicon electrical interconnection, according to the present invention. In step 500, a silicon wafer containing a plurality of multiple sets of unreleased MEMS structures is provided. Then, in step 510, the wafer is diced into individual, singulated MEMS dies. Then, in step 520, the MEMS device on a die is released. Then, in step 530, the released MEMS device is encapsulated and protected in a vapor-deposited protective coating, such as vapor-deposited parylene. Then, in step 540, the die is die attached to a package substrate. Next, in step 550, the MEMS device is electrically interconnected to the package using the process described earlier in FIGS. 4, 5, 6, or 9A–9F. Alternatively, steps 540 and 550 may be combined by flip-chip bonding using flip-chip bonding process that is described in FIGS. 10A–10C or 11A–11E. Then, in step 560, the protected MEMS device is released a second time by removing the protective coating. This may be accomplished, in the example of a parylene coating, by dry plasma etching in a reactive oxygen ion plasma. Last, in step 570, a cover lid is attached to the package.

Alternatively, with respect to the process of FIG. 14, the MEMS devices may be released at the wafer stage, and then re-coated with a parylene protective coating, and then the wafer may be diced into individual dies. This option re-orders the sequence of steps 510, 520 and 530. However, steps 540–570 remain the same as before.

We define the phrase "release step" or "releasing", as it refers to releasing of MEMS or IMEMS devices, to include dry plasma etching, such as dry plasma etching in a reactive oxygen ion plasma.

In another embodiment of the present invention, after a gold-based bump has been attached to the microelectronic device (as in FIGS. 9B and 11B), the bump may be coated with solder material, such as Sn/Pb or Pb—In. Alternatively, the bump may be plated by electroless Nickel (with or without a flash of gold), and then coated with a solder material. The solder material can enable interconnection to other electrodes (e.g. flip-chip bonding) at lower temperatures (e.g. 180 C) than is typically used for Au—Au compression bonding (e.g., 300–400 C).

In another embodiment of the present invention, the gold-based ball 90 in FIG. 9A (or the gold-based ball 226 in FIG. 11A) may be made entirely of a eutectic composition (e.g., Au-3Si or Au-12Ge). Then, after the ball has been made into bump 94 (see FIG. 9B) or bump 227 (see FIG. 11B), the subsequent attachment of the bump to electrode 96 (see FIG. 9D) or to bond pad 233 (see FIG. 11D) may be made by melting all (or part) of the bump (i.e., by heating above the eutectic temperature of 363 for Au-3Si or 361 C for Au-12Ge) thereby forming the liquid eutectic phase. Balls made of Au-3Si or Au-12Ge may be made by mechanical alloying using a high-energy ball mill, or by fabrication from a re-solidified batch of eutectic composition, as is well-known in the art.

In another embodiment of the present invention, balls 126 and 126' in FIG. 10A may be made from the eutectic composition (e.g., Au-3Si or Au-12Ge). Then, in FIG. 10B, the electrical interconnection between device 112 and substrate 100 may be easily made by melting balls 126 and 126' to a temperature above their respective eutectic temperature.

Figure 17:
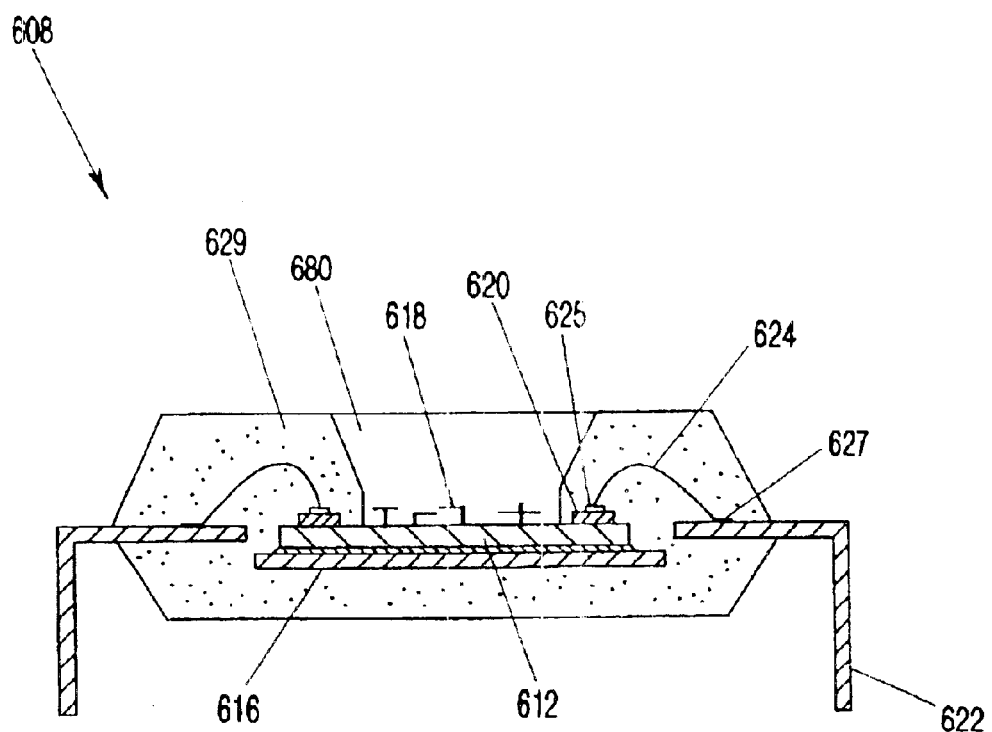
FIG. 17 shows a cross-section view of a schematic packaged MEMS device, according to an embodiment of the present invention.

FIG. 17 shows a cross-section view of a schematic packaged MEMS device, according to an embodiment of the present invention. Package 608 comprises MEMS structures 618 fabricated on silicon die 612. Die 612 has been die attached to a paddle 616. Bonding pads 620 are electrically connected, as needed, to the appropriate corresponding MEMS structures 618 that require application of electrical voltage or current. Bond pad 620 is electrically interconnected via gold-based wire 624 to electrical lead 622, which is part of an electrical lead frame. Wire 624 is joined at the proximal end directly to polysilicon pad 620 with a gold-based ball bond 625 made by compression bonding without an aluminum or titanium layer. Wire 624 is then joined at the distal (i.e., corresponding) end to electrical lead 622 with a wedge bond 627. Alternatively, bond 625 may be a wedge bond. After all of the electrical interconnections have been made, the assembly is injection molded with plastic to form a plastic enclosure 629. An opening or aperture 680 in plastic enclosure 629 may be used to provide access to released MEMS structures 618.

Figure 18:
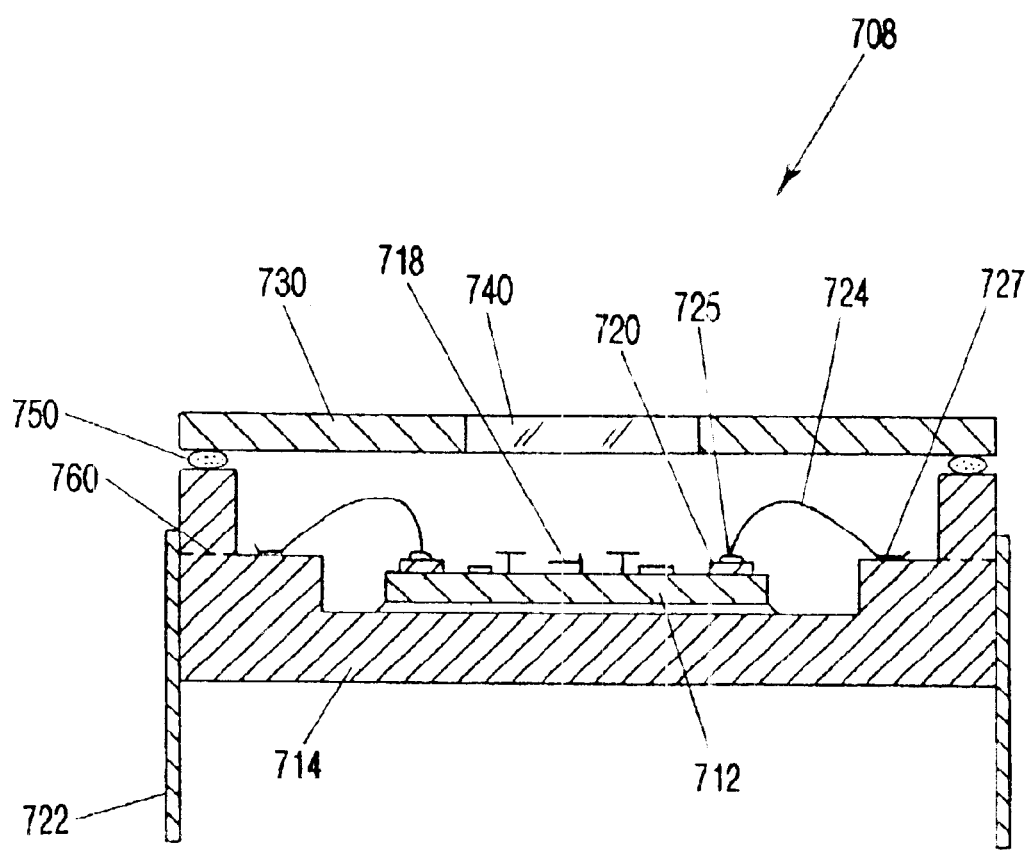
FIG. 18 shows a cross-section view of a schematic packaged MEMS device, according to an embodiment of the present invention.

FIG. 18 shows a cross-section view of a schematic packaged MEMS device, according to an embodiment of the present invention. Package 708 comprises MEMS structures 718 fabricated on silicon die 712. Die 712 has been die attached to a ceramic substrate 714. Bonding pads 720 are electrically connected, as needed, to the appropriate corresponding MEMS structures 718 that require application of electrical voltage or current. Bond pad 720 is electrically interconnected via gold-based wire 724 to electrical lead 722, which is side-brazed to ceramic substrate 714 and is electrically connected to conductive trace 760. Substrate 714 can comprise a Low-Temperature Cofired Ceramic (LTCC) material, or a High-Temperature Cofired Ceramic (HTCC) material. Wire 724 is joined at the proximal end directly to polysilicon pad 720 with a gold-based ball bond 725 made by compression bonding without an aluminum or titanium layer. Wire 724 is then joined at the distal (i.e., corresponding) end to conductive (race 760 with a wedge bond 727. Alternatively, bond 725 may be a wedge bond. After all of the electrical interconnections have been made, MEMS structures 718 may be released, and then a cover lid 730 may be attached to ceramic substrate 714 with seal 750. Cover lid 730 can have a transparent window 740 to provide optical access to MEMS structures 718. Seal 750 may be a polymer adhesive, a solder, a braze, a glass frit, a silicone, or a material capable of hermetic sealing. Heat treating of bond 725 can occur during hermetic sealing of lid 730 to substrate 714.

Experimental Results

We have observed that a thin layer of sputtered gold, 5000 angstroms thick, deposited on a polysilicon surface doesn't have very good adhesion. Next, we made a gold thermosonic ball-bonded bond on top of the gold-coated polysilicon surface, using an initial preheat temperature of 150 C. These ball-bonds were strong enough to break in the wire when tested. Also, ball shear strengths were measured to be about 20 grams, and fail by pulling the sputtered gold off the polysilicon surface.

We have observed that heat treating to 420 C and 450 C doesn't uniformly cause a sputtered gold coating to react with polysilicon. However, if "activated" by gold thermosonic ball-bonding, then the eutectic reaction has an initiation site and can go forward.

A series of post-joining heat treatment experiments were performed. A large number of gold ball-bonds were made to a polysilicon surface using a K&S 4524AD ball bonder machine. The stage was pre-heated to 150 C. The "ball-only" mode was used. The following machine settings were used: Time=2.5, Force=1.5, Power=4.03, Tail=3.0, and Ball=3.5. After thermosonic bonding, the sample was placed on heated stage that had been pre-heated to 400 C for successive increments of 15 seconds. For example, after 15 seconds the sample was removed and a large number of balls were sheared off using a BT-24 shear tester. Then the sample was placed back on the heated stage and heated at 400 C for an additional 15 seconds (total=30 seconds). Then, the sample was removed and a new set of balls were sheared off. This process was repeated two more times at 45 seconds and 60 seconds of cumulative time at 400 C. Five or ten identical balls were tested for each data point, depending on the run. Table 1 shows the results, including the control case for no post-joining heat treatment. These results show an increase in the ball bond shear strength from a range of 52–66 grams without any heal treatment (e.g. control), to a range of 126–204 grams after heat treating at 400 C for 60 seconds. The average increase in strength was measured to be about a factor of 1.5 for 30 seconds (e.g., 50% increase), and a factor of 2 for 60 seconds (e.g. 100% increase). However, a significant increase in the variation in strengths (e.g. standard deviation) was observed at 60 seconds. This could indicate the beginning of overaging effects, such as brittleness.

TABLE 1

Average Shear Loads to Failure (grams) for Gold Ball Bumps: As Bonded and After Heat Treatment at 400° C.

| 0 seconds | 15 seconds | 30 seconds | 45 seconds | 60 seconds |
|---|---|---|---|---|
| 49.6 | 66.8 | 103.9 | 109.3 | 204.1 |
| 60.8 | 64.7 | 110.6 | 141.2 | 167.4 |
| 59 | 67.1 | 86.5 | 136.2 | 126.3 |
| 65.8 | 61.4 | 102.3 | 131 | 159.4 |
| 52 | 57.8 | 128.3 | 131.9 | 136.5 |

Figure 15:
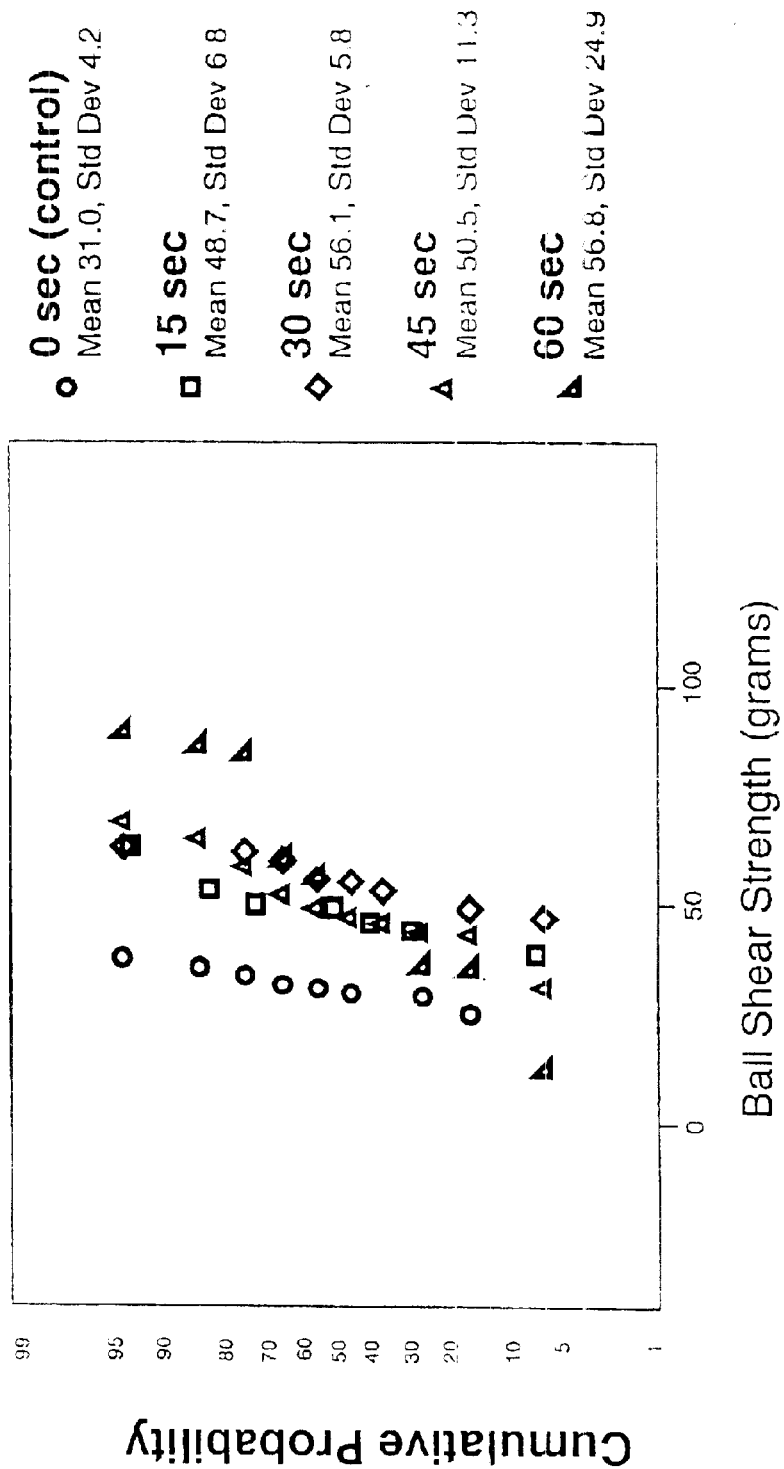
FIG. 15 plots ball shear strength test data in the form of a cumulative probability plot for heat treatment at 420 C for times ranging from 0–60 seconds.

FIG. 15 plots ball shear strength test data in the form of a cumulative probability plot for heat treatment at 420 C for times ranging from 0–60 seconds.

The particular examples discussed above are cited to illustrate particular embodiments of the invention. Other applications and embodiments of the apparatus and method of the present invention will become evident to those skilled in the art.

Figure 16:
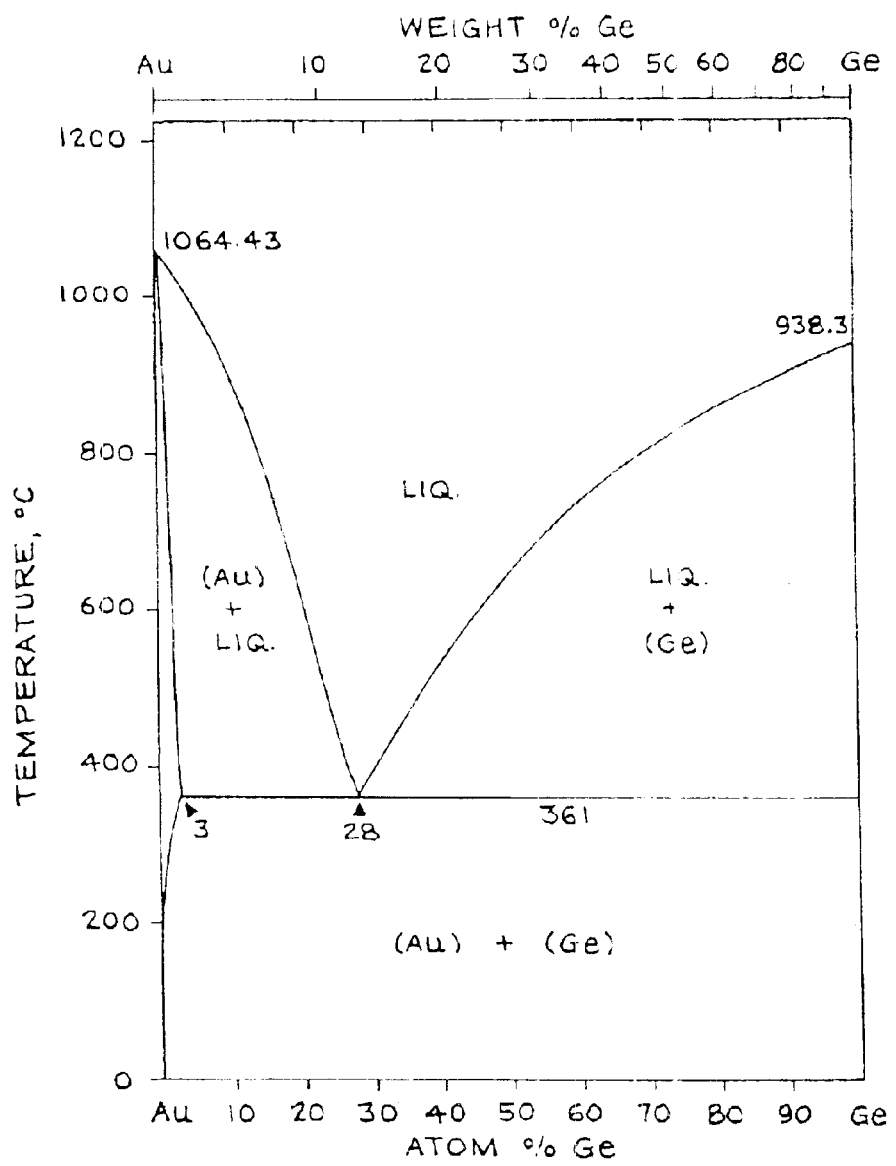
FIG. 16 shows the gold-germanium phase diagram, having a Au-12Ge eutectic composition with a melting point of 361 C.

For example, gold forms a eutectic phase with germanium (Ge) at a temperature of about 361 C, having a eutectic composition of Au-12% Ge (weight %), according to the binary phase diagram shown in FIG. 16. Germanium substrates have been used for fabricating semiconductor microelectronics, and are currently used in fabricating photovoltaic (solar) cells. Germanium may be used as a replacement for polysilicon layers in MEMS construction. Also, Si—Ge alloys may be used in place of Si wafers. MEMS device can utilize alternating layers of Si and Ge, as well. Therefore, the entire specification presented above may be applied equally well for a bond made between gold (or a gold-based material) and a germanium substrate/surface, instead of a silicon substrate/surface.

The actual scope of the invention is defined by the claims appended hereto.

We claim:

1. An electrical interconnection, comprising:
   a microelectronic device comprising a silicon surface; and
   a gold-based electrical conductor compression bonded directly to the silicon surface;
   wherein at least some of the silicon of the silicon surface makes direct, intimate physical contact with at least some of the gold of the gold-based electrical conductor.

2. The electrical interconnection of claim 1, wherein the bond between the gold-based electrical conductor and the silicon surface comprises a reaction layer.

3. The electrical interconnection of claim 2, wherein the reaction layer comprises a re-solidified eutectic phase having a composition of gold plus about 3 wt % silicon.

4. The electrical interconnection of claim 2, wherein the thickness of the reaction layer is greater than or equal to approximately 0.001 inches.

5. The electrical interconnection of claim 2, wherein the reaction layer comprises a solid-state diffusion zone comprising an interdiffused mixture of gold and silicon atoms.

6. The electrical interconnection of claim 1, wherein the microelectronic device comprises one or more devices selected from the group consisting of MEMS, IMEMS, and MOEMS devices.

7. The electrical interconnection of claim 1, wherein the gold-based electrical conductor comprises a shape selected from the group consisting of a ball, a deformed ball, a deformed ball with an attached wire, a bump, a wedge, a pad, a square pad, a round pad a rectangular pad, a pillar, a round pillar, a post, a wire, a ribbon, a lead, a TAB lead, a beam lead, and a plate.

8. The electrical interconnection of claim 1, wherein the silicon surface comprises one or more materials selected from the group consisting of single-crystal silicon, polycrystalline silicon, doped silicon, a silicon wafer and a silicon die.

9. The electrical interconnection of claim 6, wherein the silicon surface comprises a polysilicon bond pad disposed on the MEMS, IMEMS, or MOEMS device.

10. The electrical interconnection of claim 1, wherein the gold-based electrical conductor comprises one or more materials selected from the group consisting of pure gold, gold plus one or more trace elements selected to improve mechanical properties, beryllium-stabilized gold, copper-stabilized gold, gold plus one or more non-trace alloying elements, gold plus about 2 wt % palladium, gold plus about 3 wt % silicon, gold plus about 12 wt % germanium, a conducting material coated with gold, and a conducting material coated with electrolytic gold.

11. The electrical interconnection of claim 1, wherein the silicon surface comprises polysilicon doped with one or more dopants that increase the electrical conductivity selected from the group consisting of n-type dopants, p-type dopants, phosphorous, and boron.

12. The electrical interconnection of claim 1, wherein part of the gold-based electrical conductor comprises an exposed surface that is not bonded to the silicon surface; and further wherein a layer of solder coats at least some of said exposed surface.

13. The electrical interconnection of claim 12, further comprising an intermediate layer disposed underneath the solder coating, wherein the intermediate layer comprises one or more materials selected from the group consisting of nickel, electroless nickel, a flash of gold, and nickel covered by a flash of gold.

14. The electrical interconnection of claim 1, wherein the bond between the gold-based electrical conductor and the silicon surface does not contain any aluminum or titanium or solder.

15. An electrical interconnection, comprising:

a microelectronic device comprising a silicon surface; and a gold-based electrical conductor compression bonded directly to the silicon surface;

wherein at least some of the silicon of the silicon surface makes direct, intimate physical contact with at least some of the gold of the gold-based electrical conductor;

wherein the bond between the gold-based electrical conductor and the silicon surface does not contain any aluminum or titanium or solder; and wherein the gold-based electrical conductor comprises a Au-3Si eutectic composition.

* * * * *